(12) United States Patent
Yoon et al.

(10) Patent No.: US 12,322,470 B2
(45) Date of Patent: *Jun. 3, 2025

(54) SEMICONDUCTOR DEVICES AND SEMICONDUCTOR SYSTEMS CALIBRATING TERMINATION RESISTANCE

(71) Applicant: SK hynix Inc., Icheon-si (KR)

(72) Inventors: Sang Sic Yoon, Icheon-si (KR); Jung Taek You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 86 days.

This patent is subject to a terminal disclaimer.

(21) Appl. No.: 18/449,252

(22) Filed: Aug. 14, 2023

(65) Prior Publication Data

US 2023/0386532 A1    Nov. 30, 2023

Related U.S. Application Data

(63) Continuation-in-part of application No. 18/116,001, filed on Mar. 1, 2023, now Pat. No. 12,198,784.

(30) Foreign Application Priority Data

| Apr. 19, 2022 | (KR) | 10-2022-0048459 |
| May 4, 2022 | (KR) | 10-2022-0055763 |
| Oct. 11, 2022 | (KR) | 10-2022-0130003 |

(51) Int. Cl.
*G11C 7/10* (2006.01)
*G11C 7/22* (2006.01)

(52) U.S. Cl.
CPC ............ *G11C 7/1048* (2013.01); *G11C 7/222* (2013.01); *G11C 2207/2254* (2013.01)

(58) Field of Classification Search
CPC ............... G11C 7/1048; G11C 7/222; G11C 2207/2254; G11C 7/1057; G11C 7/1084;
(Continued)

(56) References Cited

U.S. PATENT DOCUMENTS 10,318,464 B1    6/2019    Jiang et al.
10,529,390 B1    1/2020    Satoh et al.
(Continued)

FOREIGN PATENT DOCUMENTS

KR    1020210070557 A    6/2021

*Primary Examiner* — Fernando Hidalgo
(74) *Attorney, Agent, or Firm* — WILLIAM PARK & ASSOCIATES LTD.

(57) ABSTRACT

A semiconductor system according to an embodiment of the present disclosure includes a controller configured to output a command address, a first chip selection signal, and a second chip selection signal, and a semiconductor device, including a first rank and a second rank, configured to receive the command address, the first chip selection signal, and the second chip selection signal and configured to calibrate each termination resistance value based on the command address, the first chip selection signal, and the second chip selection signal. The first rank calibrates the termination resistance value of the first rank to a target resistance value based on the command address and the first chip selection signal when a write operation on the first rank is performed, and the first rank calibrates the termination resistance value of the first rank to a dynamic resistance value based on the second chip selection signal when a write operation on the second rank is performed.

21 Claims, 20 Drawing Sheets

(58) Field of Classification Search
CPC . G11C 29/028; G11C 29/22; G11C 29/50008;
G11C 11/4093
USPC .................................................. 365/189.18
See application file for complete search history.

(56) References Cited

U.S. PATENT DOCUMENTS

| | | |
|---|---|---|
| 12,224,747 B2 * | 2/2025 | Lim ..................... G11C 7/222 |
| 2018/0053567 A1 | 2/2018 | Kim |
| 2020/0310689 A1 | 10/2020 | Park et al. |
| 2021/0151117 A1 | 5/2021 | Kim et al. |
| 2021/0166743 A1 | 6/2021 | Itagaki |
| 2021/0175887 A1 | 6/2021 | Hiemstra et al. |
| 2022/0059148 A1 | 2/2022 | Kim et al. |
| 2022/0284946 A1 | 9/2022 | Kang et al. |
| 2023/0420008 A1 | 12/2023 | Tian |

* cited by examiner

SEMICONDUCTOR DEVICES AND SEMICONDUCTOR SYSTEMS CALIBRATING TERMINATION RESISTANCE

CROSS-REFERENCE TO RELATED APPLICATIONS

This application is a continuation-in-part of U.S. patent application Ser. No. 18/116,001, filed on Mar. 1, 2023, which claims the priority under 35 U.S.C. § 119(a) to Korean Patent Application No. 10-2022-0048459, filed on Apr. 19, 2022, Korean Patent Application No. 10-2022-0055763, filed on May 4, 2022, and Korean Patent Application No. 10-2022-0130003, filed on Oct. 11, 2022, which are incorporated herein by reference in their entirety.

BACKGROUND

1. Technical Field

Embodiments of the present disclosure relate to a semiconductor device, and more particularly, to a semiconductor device related to calibrating a termination resistance.

2. Related Art

In the case of a semiconductor device, a command and an address are input in synchronization with a clock. A double data rate (DDR) type semiconductor device receives the command and address in synchronization with a rising edge and a falling edge of the clock, and a single data rate (SDR) type semiconductor device receives the command and address in synchronization with a rising edge of the clock.

Meanwhile, the semiconductor device is implemented to include a plurality of ranks sharing input/output lines, and performs an on-die termination (ODT) operation to prevent or mitigate signal reflection of the shared input/output lines. Accordingly, commands for controlling the on-die termination (ODT) operation have been added.

SUMMARY

An embodiment of the present disclosure may provide a semiconductor system including a controller configured to output a command address, a first chip selection signal, and a second chip selection signal, and a semiconductor device, including a first rank and a second rank, configured to receive the command address, the first chip selection signal, and the second chip selection signal and configured to calibrate each termination resistance value based on the command address, the first chip selection signal, and the second chip selection signal. The first rank may calibrate the termination resistance value of the first rank to a target resistance value based on the command address and the first chip selection signal when a write operation on the first rank is performed, and the first rank may calibrate the termination resistance value of the first rank to a dynamic resistance value based on the second chip selection signal when a write operation on the second rank is performed.

In addition, an embodiment of the present disclosure may provide a semiconductor system including a controller configured to output a command address, a first chip selection signal, a second chip selection signal, and a third chip selection signal, and a semiconductor device including a first rank, a second rank, and a third rank configured to receive the command address, the first chip selection signal, the second chip selection signal, and the third chip selection signal and configured to calibrate each termination resistance value based on the command address, the first chip selection signal, the second chip selection signal, and the third chip selection signal. The first rank may calibrate the termination resistance value of the first rank to a target resistance value based on the command address and the first chip selection signal when a write operation on the first rank is performed, and the first rank may calibrate the termination resistance value of the first rank to a dynamic resistance value based on the second chip selection signal and the third chip selection signal when the write operation on the first rank is not performed.

In addition, an embodiment of the present disclosure may provide a semiconductor device including a first rank configured to calibrate a first termination resistance value to a target resistance value when a write command is input through a command address in a state in which a first chip selection signal including a pulse that is driven to a voltage level set to be equal to or higher than a first reference voltage is received, and a second rank configured to calibrate a second termination resistance value to the target resistance value when the write command is input in a state in which a second chip selection signal including the pulse that is driven to the voltage level set to be equal to or higher than the first reference voltage is received. In the present disclosure, the first rank may calibrate the termination resistance value of the first rank to a dynamic resistance value when a write operation on the second rank is performed, and the second chip selection signal including a pulse that is driven to a voltage level set to be equal to or higher than a second reference voltage set higher than the first reference voltage is received.

DETAILED DESCRIPTION OF THE EMBODIMENTS

In the following description of embodiments, when a parameter is referred to as being "predetermined" or "preset" it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
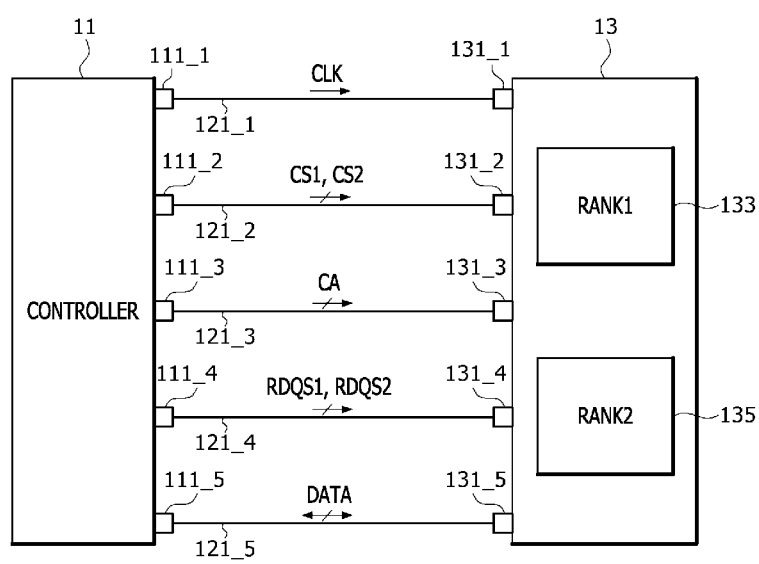
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As shown in FIG. 1, the semiconductor system 1 may include a controller 11 and a semiconductor device 13.

The controller 11 may include a first control pin 111_1, a second control pin 111_2, a third control pin 111_3, a fourth control pin 111_4, and a fifth control pin 111_5. The semiconductor device 13 may include a first device pin 131_1, a second device pin 131_2, a third device pin 131_3, a fourth device pin 131_4, and a fifth device pin 131_5. The controller 11 may transmit a clock CLK to the semiconductor device 13 through a first transmission line 121_1 connected between the first control pin 111_1 and the first device pin 131_1. The controller 11 may transmit chip selection signals CS1 and CS2 to the semiconductor device 13 through a second transmission line 121_2 connected between the second control pin 111_2 and the second device pin 131_2. The second transmission line 121_2 may be separately provided for each of the chip selection signals CS1 and CS2. The controller 11 may transmit a command address CA to the semiconductor device 13 through a third transmission line 121_3 connected between the third control pin 111_3 and the third device pin 131_3. In the present embodiment, the command address CA may include a command for performing internal operations including a write operation, a read operation, and the like and an address including a bank address, a row address, a column address, and the like. Each of the third control pin 111_3, the third transmission line 121_3, and the third device pin 131_3 may be implemented in plurality according to the number of bits of the command address CA. The controller 11 may transmit read strobe signals RDQS1 and RDQS2 to the semiconductor device 13 through a fourth transmission line 121_4 connected between the fourth control pin 111_4 and the fourth device pin 131_4. The fourth transmission line 121_4 may be separately provided for each of the read strobe signals RDQS1 and RDQS2. The controller 11 may transmit transmission data DATA to the semiconductor device 13 through a fifth transmission line 121_5 connected between the fifth control pin 111_5 and the fifth device pin 131_5. The controller 11 may receive the transmission data DATA from the semiconductor device 13 through the fifth transmission line 121_5 connected between the fifth control pin 111_5 and the fifth device pin 131_5. Each of the fifth control pin 111_5, the fifth device pin 131_5, and the fifth transmission line 121_5 may be implemented in plurality according to the number of bits of the transmission data DATA.

The semiconductor device 13 may include a first rank 133 and a second rank 135. Each of the first rank 133 and the second rank 135 may perform a write operation of receiving and storing the transmission data DATA, and may perform a read operation of outputting the transmission data DATA to the controller 11, based on the clock CLK, the chip selection signals CS1 and CS2, and the command address CA that are received from the controller 11. Each of the first rank 133 and the second rank 135 may calibrate a termination resistance value thereof to a preset target resistance value (T_ODT of FIG. 4) when a write operation is performed. Here, the termination resistance value may refer to a resistance value of a termination resistor provided for impedance matching at a receiving end (not shown) at which the transmission data DATA is received during the write operation. Each of the first rank 133 and the second rank 135 may calibrate each termination resistance value to a preset non-target resistance value (NT_ODT of FIG. 4) when a write operation is not performed or at least one of the read strobe signals RDQS1 and RDQS2 is not at a preset logic level. The first rank 133 may calibrate the termination resistance value of the first rank 133 to a preset dynamic resistance value (D_ODT of FIG. 4) when a write operation of the second rank 135 is performed. The second rank 135 may calibrate the termination resistance value of the second rank 135 to a preset dynamic resistance value (D_ODT of FIG. 4) when a write operation of the first rank 133 is performed.

Figure 2:
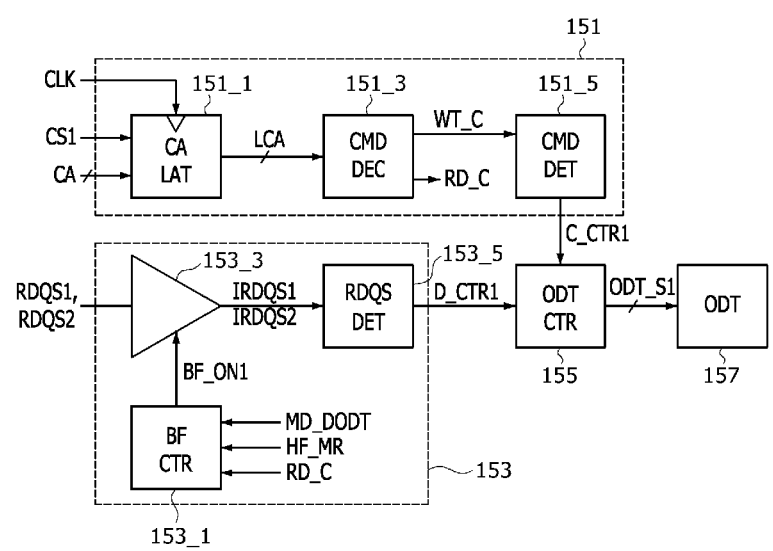
FIG. 2 is a block diagram illustrating a configuration of a first rank according to an embodiment of the present disclosure.

FIG. 2 is a block diagram illustrating a configuration of a first rank 133A according to an example of the first rank 133 shown in FIG. 1. As shown in FIG. 2, the first rank 133A may include a command control signal generation circuit 151, a dynamic control signal generation circuit 153, a termination control circuit 155, and a termination circuit 157.

The command control signal generation circuit 151 may generate a first command control signal C_CTR1 that is activated when a write operation of the first rank 133A is performed. To this end, the command control signal generation circuit 151 may include a command address latch circuit (CA LAT) 151_1, a command decoder (CMD DEC) 151_3, and a command detection circuit (CMD DET) 151_5. The command address latch circuit 151_1 may generate a latch command address LCA from a command address CA based on a clock CLK and a first chip selection signal CS1. The command address latch circuit 151_1 may latch the command address CA in synchronization with the clock CLK when the first chip selection signal CS1 is activated for various internal operations including a write operation and a read operation of the first rank 133A, and may output the latched command address CA as the latch command address LCA. The command address latch circuit 151_1 may be connected to the command decoder 151_3 to apply the latch command address LCA to the command decoder 151_3. The command decoder 151_3 may generate a write command WT_C and a read command RD_C from the latch command address LCA that is received from the command address latch circuit 151_1. The command decoder 151_3 may decode the latch command address LCA to generate the write command WT_C for a write operation of the first rank 133A and to generate the read command RD_C for a read operation of the first rank 133A. The command decoder 151_3 may be connected to the command detection circuit 151_5 and a buffer control signal generation circuit (BF CTR) 153_1 to apply the write command WT_C to the command detection circuit 151_5 and to apply the read command RD_C to the buffer control signal generation circuit 153_1. The command detection circuit 151_5 may generate a first command control signal C_CTR1 based on the write command WT_C. The command detection circuit 151_5 may generate a first command control signal C_CTR1 that is activated when the write command WT_C is generated for the write operation of the first rank 133A. The command detection circuit 151_5 may be connected to the termination control circuit 155 to apply the first command control signal C_CTR1 to the termination control circuit 155.

The dynamic control signal generation circuit 153 may generate a first dynamic control signal D_CTR1 that is enabled to set a termination resistance value of the first rank 133A to a preset dynamic resistance value (D_ODT in FIG. 4), based on a first read strobe signal RDQS1 and a second read strobe signal RDQS2 in a state in which the write operation of the second rank 135 is performed and a dynamic termination mode or a high-frequency mode is entered. To this end, the dynamic control signal generation circuit 153 may include the buffer control circuit (BF_CTR) 153_1, a buffer circuit 153_3, and a read strobe signal detection circuit (RDQS DET) 153_5. The buffer control circuit 153_1 may generate a first buffer enable signal BF_ON1 based on a dynamic termination mode signal MD_DODT, a high-frequency mode signal HF_MR, and a read command RD_C. The dynamic termination mode signal MD_DODT may be activated in a dynamic termination mode for setting a termination resistance value of a non-target rank to a dynamic resistance value (D_ODT in FIG. 4), and the high-frequency mode signal HF_MR may be activated in a high-frequency mode in which an operating frequency is set to be high. Whether the dynamic termination mode signal MD_DODT and the high-frequency mode signal HF_MR are activated may be determined through a test mode or a mode register set operation. The buffer control circuit 153_1 may generate a first buffer enable signal BF_ON1 that is activated when entering the dynamic termination mode by the dynamic termination mode signal MD_DODT or entering the high-frequency mode by the high-frequency mode signal HF_MR. The buffer control circuit 153_1 may generate a first buffer enable signal BF_ON1 that is deactivated at a time point when a preset buffer control period elapses when a read operation for the first rank 133A is performed and a read command RD_C is generated. The buffer control period may be set in consideration of a period in which the first read strobe signal RDQS1 and the second read strobe signal RDQS2 are received in order to calibrate the termination resistance value. The buffer control circuit 153_1 may be connected to the buffer circuit 153_3 to apply the first buffer enable signal BF_ON1 to the buffer circuit 153_3. The buffer circuit 153_3 may receive the first read strobe signal RDQS1 and the second read strobe signal RDQS2 based on the first buffer enable signal BF_ON1 to generate a first internal read strobe signal IRDQS1 and a second internal read strobe signal IRDQS2. The buffer circuit 153_3 may buffer the first read strobe signal RDQS1 to generate the first internal read strobe signal IRDQS1, and may buffer the second read strobe signal RDQS2 to generate the second internal read strobe signal IRDQS2 when the first buffer enable signal BF_ON1 is activated. The buffer circuit 153_3 may be connected to the read strobe signal detection circuit 153_5 to apply the first internal read strobe signal IRDQS1 and the second internal read strobe signal IRDQS2 to the read strobe signal detection circuit 153_5. The read strobe signal detection circuit 153_5 may generate a first dynamic control signal D_CTR1 based on the first internal read strobe signal IRDQS1 and the second internal read strobe signal IRDQS2. More specifically, the read strobe signal detection circuit 153_5 may generate the first dynamic control signal D_CTR1 that is activated when each of the first internal read strobe signal IRDQS1 and the second internal read strobe signal IRDQS2 is set to have a preset logic level. For example, the read strobe signal detection circuit 153_5 may generate the first dynamic control signal D_CTR1 that is activated when both the first internal read strobe signal IRDQS1 and the second internal read strobe signal IRDQS2 are set to have a logic "high" level. The logic level of each of the first internal read strobe signal IRDQS1 and the second internal read strobe signal IRDQS2 may be variously set according to embodiments. The read strobe signal detection circuit 153_5 may be connected to the termination control circuit 155 to apply the first dynamic control signal D_CTR1 to the termination control circuit 155.

The termination control circuit 155 may generate a first termination resistance calibration signal ODT_S1 for calibrating a termination resistance value of the termination circuit 157, based on the first command control signal C_CTR1 that is received from the command detection circuit 151_5 and the first dynamic control signal D_CTR1 that is received from the read strobe signal detection circuit 153_5. The termination control circuit 155 may generate the first termination resistance calibration signal ODT_S1 for calibrating the termination resistance value of the termination circuit 157 to a target resistance value (T_ODT of FIG. 4) when the first command control signal C_CTR1 is activated and the first dynamic control signal D_CTR1 is deactivated. The termination control circuit 155 may generate the first termination resistance calibration signal ODT_S1 for calibrating the termination resistance value of the termination circuit 157 to a dynamic resistance value (D_ODT of FIG. 4) when the first command control signal C_CTR1 is deactivated and the first dynamic control signal D_CTR1 is activated. The termination control circuit 155 may generate the first termination resistance calibration signal ODT_S1 for calibrating the termination resistance value of the termination circuit 157 to a non-target resistance value (NT_ODT of FIG. 4) when the first command control signal C_CTR1 is deactivated and the first dynamic control signal D_CTR1 is deactivated. The termination resistance value of the termination circuit 157 may be set to a resistance value of a termination resistor (not shown) provided in the first rank 133A. By calibrating the logic bit set of bits included in the first termination resistance calibration signal ODT_S1 or by calibrating a voltage level of the first termination resistance calibration signal ODT_S1, the termination resistance value of the termination circuit 157 may be implemented to be set to have one of the target resistance value (T_ODT in FIG. 4), the dynamic resistance value (D_ODT in FIG. 4), and the non-target resistance value (NT_ODT in FIG. 4).

Figure 3:
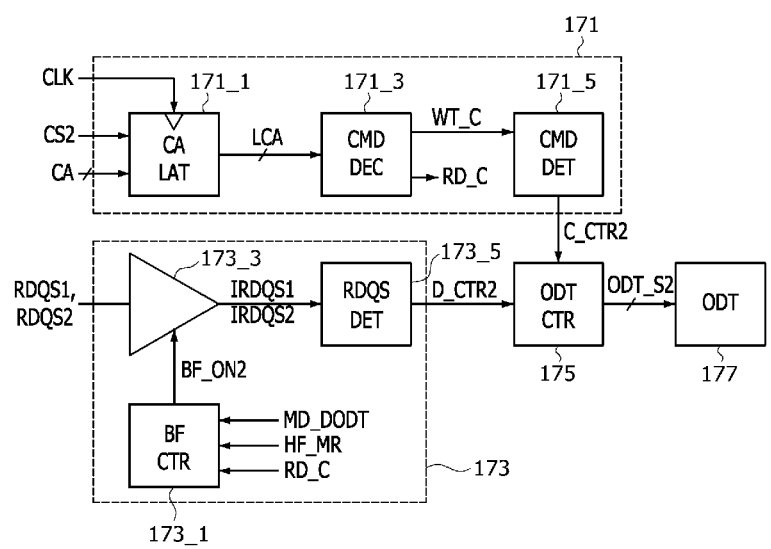
FIG. 3 is a block diagram illustrating a configuration of a second rank according to an embodiment of the present disclosure.

FIG. 3 is a block diagram illustrating a configuration of a second rank 135A according to an example of the second rank 135 shown in FIG. 1. As shown in FIG. 3, the second rank 135A may include a command control signal generation circuit 171, a dynamic control signal generation circuit 173, a termination control circuit 175, and a termination circuit 177.

The command control signal generation circuit 171 may generate a second command control signal C_CTR2 that is activated when a write operation of the second rank 135A is performed. To this end, the command control signal generation circuit 171 may include a command address latch circuit (CA LAT) 171_1, a command decoder (CMD DEC) 171_3, and a command detection circuit (CMD DET) 171_5. The command address latch circuit 171_1 may generate a latch command address LCA from a command address CA, based on a clock CLK and a second chip selection signal CS2. The command address latch circuit 171_1 may latch the command address CA in synchronization with the clock CLK when the second chip selection signal CS2 is activated for various internal operations including a write operation, a read operation, and the like of the second rank 135A, and may output the latched command address CA as the latch command address LCA. The command decoder 171_3 may generate a write command WT_C and a read command RD_C from the latch command address LCA that is received from the command address latch circuit 171_1. The command decoder 171_3 may decode the latch command address LCA to generate the write command WT_C for a write operation of the second rank 135A and to generate the read command RD_C for a read operation of the second rank 135A. The command decoder 171_3 may be connected to the command detection circuit 171_5 and the buffer control signal generation circuit (BF CTR) 173_1 to apply the write command WT_C to the command detection circuit 171_5 and to apply the read command RD_D to the buffer control signal generation circuit 173_1. The command detection circuit 171_5 may generate a second command control signal C_CTR2 based on the write command WT_C. The command detection circuit 171_5 may generate the second command control signal C_CTR2 that is activated when the write command WT_C is generated for the write operation of the second rank 135A. The command detection circuit 171_5 may be connected to the termination control circuit 175 to apply the second command control signal C_CTR2 to the termination control circuit 175.

The dynamic control signal generation circuit 173 may generate a second dynamic control signal D_CTR2 that is enabled to set a termination resistance value of the second rank 135A to a preset dynamic resistance value (D_ODT in FIG. 4) based on the first read strobe signal RDQS1 and the second read strobe signal RDQS2 in a state in which the write operation of the first rank 135A is performed and the dynamic termination mode or the high-frequency mode is entered. To this end, the dynamic control signal generation circuit 173 may include a buffer control circuit (BF_CTR) 173_1, a buffer circuit 173_3, and a read strobe signal detection circuit (RDQS DET) 173_5. The buffer control circuit 173_1 may generate a second buffer enable signal BF_ON2 based on a dynamic termination mode signal MD_DODT, a high-frequency mode signal HF_MR, and the read command RD_C. The buffer control circuit 173_1 may generate the second buffer enable signal BF_ON2 that is activated when entering the dynamic termination mode by the dynamic termination mode signal MD_DODT or entering the high-frequency mode by the high-frequency mode signal HF_MR. The buffer control circuit 173_1 may generate the second buffer enable signal BF_ON2 that is deactivated at a time point when a preset buffer control period elapses when a read operation for the second rank 135A is performed and the read command RD_C is generated. The buffer control circuit 173_1 may be connected to the buffer circuit 173_3 to apply the second buffer enable signal BF_ON2 to the buffer circuit 173_3. The buffer circuit 173_3 may receive the first read strobe signal RDQS1 and the second read strobe signal RDQS2 to generate a first internal read strobe signal IRDQS1 and a second internal read strobe signal IRDQS2 based on the second buffer enable signal BF_ON2. The buffer circuit 173_3 may buffer the first read strobe signal RDQS1 to generate the first internal read strobe signal IRDQS1 and may buffer the second read strobe signal RDQS2 to generate the second internal read strobe signal IRDQS2 when the second buffer enable signal BF_ON2 is activated. The buffer circuit 173_3 may be connected to the read strobe signal detection circuit 173_5 to apply the first internal read strobe signal IRDQS1 and the second internal read strobe signal IRDQS2 to the read strobe signal detection circuit 173_5. The read strobe signal detection circuit 173_5 may generate the second dynamic control signal D_CTR2 based on the first internal read strobe signal IRDQS1 and the second internal read strobe signal IRDQS2. More specifically, the read strobe signal detection circuit 173_5 may generate the second dynamic control signal D_CTR2 that is activated when each of the first internal read strobe signal IRDQS1 and the second internal read strobe signal IRDQS2 is set to have a preset logic level. For example, the read strobe signal detection circuit 173_5 may generate the second dynamic control signal D_CTR2 that is activated when both the first internal read strobe signal IRDQS1 and the second internal read strobe signal IRDQS2 are set to have a logic "high" level. The logic level of each of the first internal read strobe signal IRDQS1 and the second internal read strobe signal IRDQS2 set to activate the second dynamic control signal D_CTR2 may be variously set according to embodiments. The read strobe signal detection circuit 173_5 may be connected to the termination control circuit 175 to apply the second dynamic control signal D_CTR2 to the termination control circuit 175.

The termination control circuit 175 may generate a second termination resistance calibration signal ODT_S2 to adjust the termination resistance value of the termination circuit 177 based on the second command control signal C_CTR2 received from the command detection circuit 171_5 and the second dynamic control signal D_CTR2 received from the read strobe signal detection circuit 173_5. The termination control circuit 175 may generate a second termination resistance calibration signal ODT_S2 to calibrate a termination resistance value of the termination circuit 177 to a target resistance value (T_ODT in FIG. 4) when the second command control signal C_CTR2 is activated and the second dynamic control signal D_CTR2 is deactivated. The termination control circuit 175 may generate a second termination resistance calibration signal ODT_S2 to calibrate the termination resistance value of the termination circuit 177 to a dynamic resistance value (D_ODT in FIG. 4) when the second command control signal C_CTR2 is deactivated and the second dynamic control signal D_CTR2 is activated. The termination control circuit 175 may generate a second termination resistance calibration signal ODT_S2 to calibrate the termination resistance value of the termination circuit 177 to a non-target resistance value (NT_ODT in FIG. 4) when the second command control signal C_CTR2 is deactivated and the second dynamic control signal D_CTR2 is deactivated. The termination resistance value of the termination circuit 177 may be set to a resistance value of a termination resistor (not shown) provided in the second rank 135A. The termination resistance value of the termination circuit 177 may be implemented to be set to one of the target resistance value (T_ODT in FIG. 4), the dynamic resistance value (D_ODT in FIG. 4), and the non-target resistance value (NT_ODT in FIG. 4) by calibrating the logic bit set of bits included in the second termination resistance calibration signal ODT_S2 or by calibrating the voltage level of the termination resistance calibration signal ODT_S1.

Figure 4:
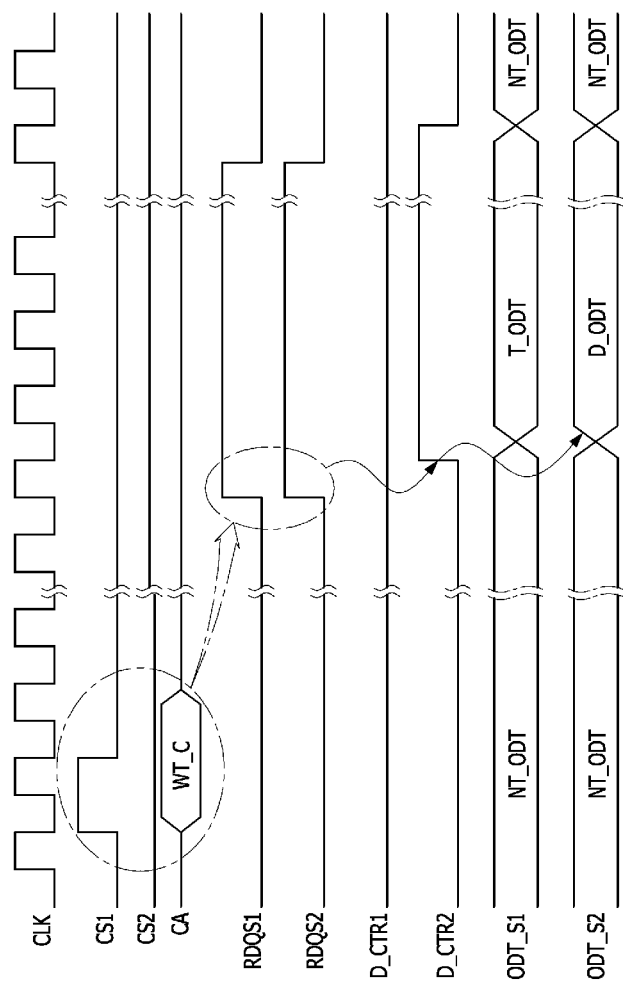
FIGS. 4, 5, and 6 are timing diagrams illustrating an operation in which a termination resistance value is calibrated in a semiconductor system according to an embodiment.
Figure 5:
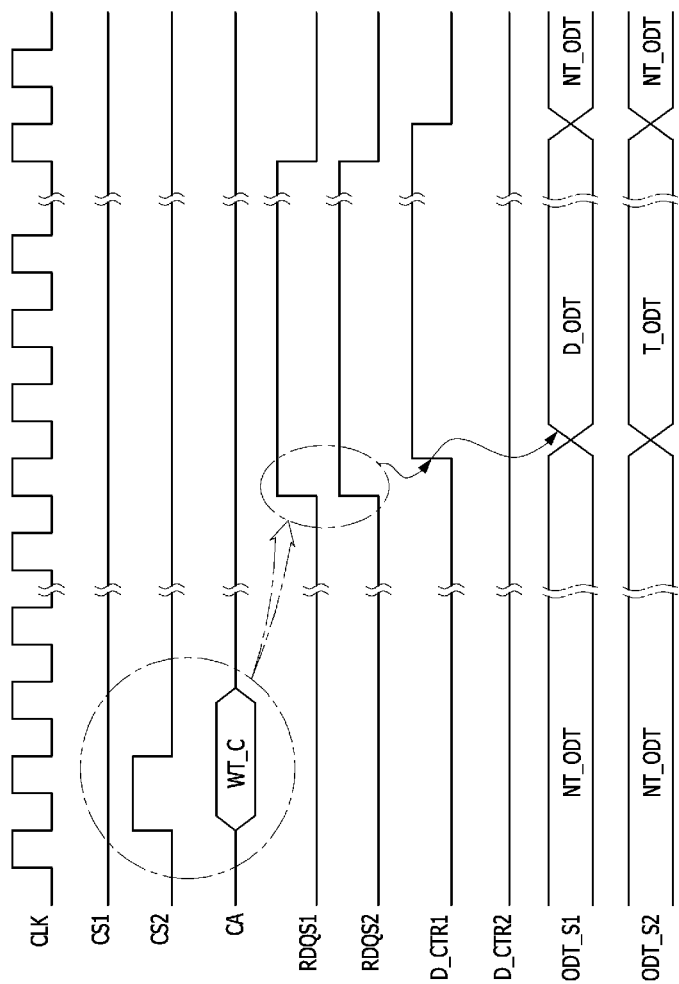
Figure 6:
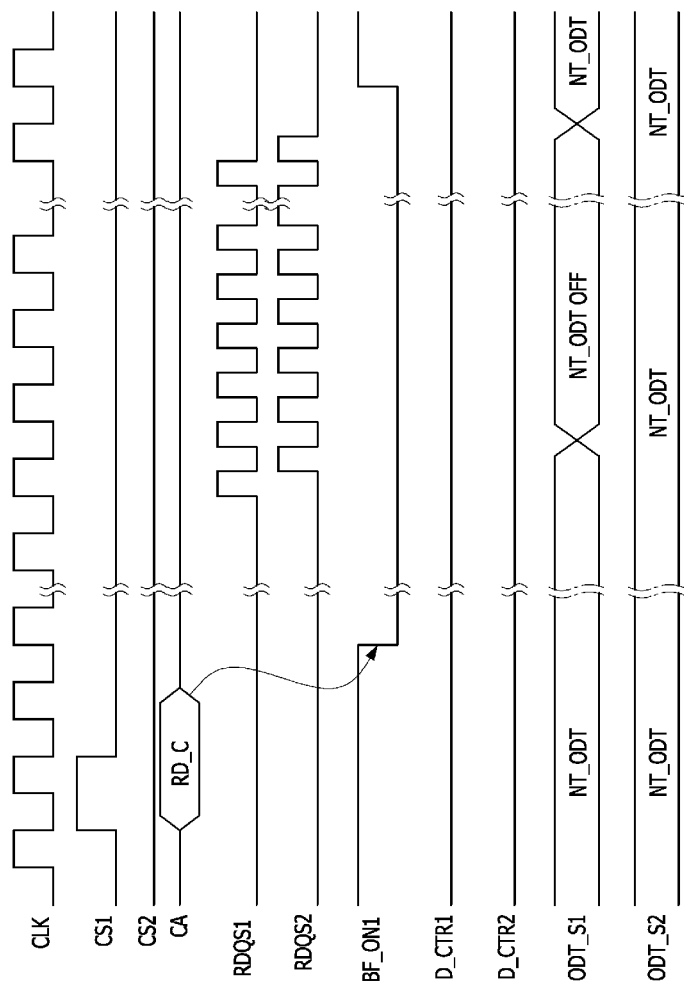

FIGS. 4 to 6 are timing diagrams illustrating an operation in which a termination resistance value is calibrated in a semiconductor system 1 according to an embodiment of the present disclosure. Referring to FIGS. 4 to 6, when a write operation on the first rank 133A shown in FIG. 2 is performed, a case in which a write operation on the second rank 135A illustrated in FIG. 3 is performed, and a case in which a read operation on the rank 133A is performed will be described as follows.

As shown in FIG. 4, when a first chip selection signal CS1 is activated at a logic "high" level, a write command WT_C is generated from a command address CA in synchronization with a clock CLK, and the write operation on the first rank 133A is performed, a first termination resistance calibration signal ODT_S1 for setting a termination resistance value of the first rank 133A to a preset target resistance value T_ODT may be generated.

Meanwhile, as shown in FIG. 4, when the write operation on the first rank 133A is performed, and a first read strobe signal RDQS1 and a second read strobe signal RDQS2 both set to have a logic "high" level are received, a second dynamic control signal D_CTR2 that is activated at a logic "high" level may be generated. When the second dynamic control signal D_CTR2 is activated at a logic "high" level, a second termination resistance calibration signal ODT_S2 may be generated for setting the termination resistance value of the second rank 135A to the preset dynamic resistance value D_ODT.

As shown in FIG. 5, when a second chip selection signal CS2 is activated at a logic "high" level, a write command WT_C is generated from the command address CA in synchronization with the clock CLK, and a write operation on the second rank 135A is performed, a second termination resistance calibration signal ODT_S2 for setting the termination resistance value of the second rank 135A to a preset target resistance value T_ODT may be generated.

Meanwhile, as shown in FIG. 5, when the write operation on the second rank 135A is performed and the first read strobe signal RDQS1 and the second read strobe signal RDQS2 both set to have a logic "high" level are received, a first dynamic control signal D_CTR1 that is activated at a logic "high" level may be generated. When the first dynamic control signal D_CTR1 is activated at a logic "high" level, a first termination resistance calibration signal ODT_S1 for setting the termination resistance value of the first rank 133A to the preset dynamic resistance value D_ODT may be generated.

As shown in FIG. 6, when the first chip selection signal CS1 is activated at a logic "high" level, a read command RD_C is generated from the command address CA in synchronization with the clock CLK, and a read operation on the first rank 133A is performed, a second termination resistance calibration signal ODT_S2 may be generated to maintain the termination resistance value of the first rank 133A as a non-target resistance value NT_ODT.

Meanwhile, because the first buffer enable signal BF_ON1 is deactivated by the read command RD_C when the read operation on the first rank 133A is performed, the buffer circuit 153_3 that receives the first read strobe signal RDQS1 and a second read strobe signal RDQS2 may be deactivated. Because the operation of setting the termination resistance value of the first rank 133A to the non-target resistance value NT_ODT by the second termination resistance calibration signal ODT_S2 is terminated in a state in which the buffer circuit 153_3 is deactivated, power consumed to set the termination resistance value of the first rank 133 may be reduced. Meanwhile, when the read operation on the first rank 133A is performed and the toggling first read strobe signal RDQS1 and second read strobe signal RDQS2 are received, the first dynamic control signal D_CTR1 and the second dynamic control signal D_CTR2 both deactivated at a logic "low" level may be generated. When the second dynamic control signal D_CTR2 is deactivated at a logic "low" level, the termination resistance value of the second rank 135A may be maintained as the non-target resistance value NT_ODT.

Figure 7:
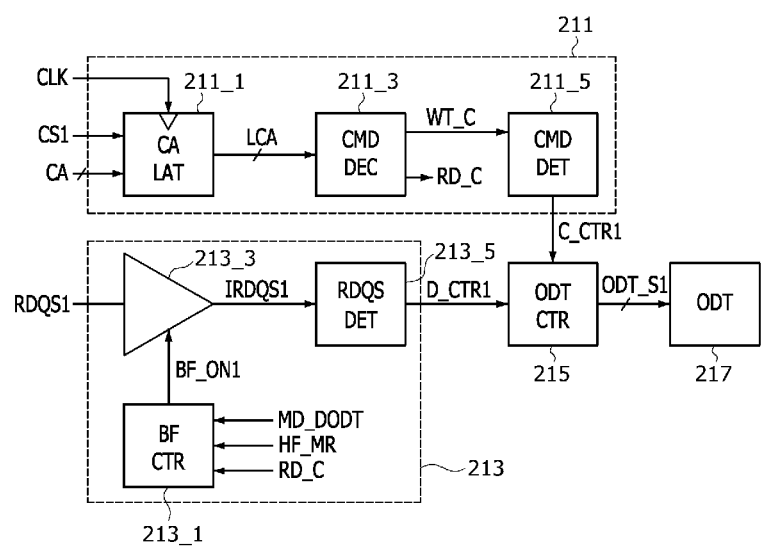
FIG. 7 is a block diagram illustrating a configuration of a first rank according to another embodiment of the present disclosure.

FIG. 7 is a block diagram illustrating a configuration of a first rank 133B according to another example of the first rank 133 shown in FIG. 1. As shown in FIG. 7, the first rank 133B may include a command control signal generation circuit 211, a dynamic control signal generation circuit 213, a termination control circuit 215, and a termination circuit 217.

The command control signal generation circuit 211 may generate a first command control signal C_CTR1 that is activated when a write operation of the first rank 133B is performed. To this end, the command control signal generation circuit 211 may include a command address latch circuit (CA LAT) 211_1, a command decoder (CMD DEC) 211_3, and a command detection circuit (CMD DET) 211_5. The command address latch circuit 211_1 may generate a latch command address LCA from a command address CA based on a clock CLK and a first chip selection signal CS1. The command address latch circuit 211_1 may latch the command address CA in synchronization with the clock CLK and may output the latched command address CA as a latch command address LCA when the first chip selection signal CS1 is activated for various internal operations including a write operation, a read operation, and the like of the first rank 133B. The command address latch circuit 211_1 may be connected to the command decoder 211_3 to apply the latch command address LCA to the command decoder 211_3. The command decoder 211_3 may generate a write command WT_C and a read command RD_C from the latch command address LCA that is received from the command address latch circuit 211_1. The command decoder 211_3 may decode the latch command address LCA to generate the write command WT_C for the write operation of the first rank 133B and to generate the read command RD_C for the read operation of the first rank 133B. The command decoder 211_3 may be connected to the command detection circuit 211_5 and the buffer control signal generation circuit (BF CTR) 213_1 to apply the write command WT_C to the command detection circuit 211_5 and to apply the read command RD_C to the buffer control signal generation circuit 213_1. The command detection circuit 211_5 may generate a first command control signal C_CTR1 based on the write command WT_C. The command detection circuit 211_5 may generate the first command control signal C_CTR1 that is activated when the write command WT_C is generated for the write operation of the first rank 133B. The command detection circuit 211_5 may be connected to the termination control circuit 215 to apply the first command control signal C_CTR1 to the termination control circuit 215.

The dynamic control signal generation circuit 213 may generate a first dynamic control signal D_CTR1 that is enabled to set a termination resistance value of the first rank 133B to a preset dynamic resistance value D_ODT, based on a read strobe signal RDQS1 in a state in which a write operation of a second rank (135 in FIG. 1) is performed and a dynamic termination mode or a high-frequency mode is entered. To this end, the dynamic control signal generation circuit 213 may include a buffer control circuit (BF_CTR) 213_1, a buffer circuit 213_3, and a read strobe signal detection circuit (RDQS DET) 213_5. The buffer control circuit 213_1 may generate a first buffer enable signal BF_ON1 based on a dynamic termination mode signal MD_DODT, a high-frequency mode signal HF_MR, and a read command RD_C. The buffer control circuit 213_1 may generate the first buffer enable signal BF_ON1 that is activated when entering a dynamic termination mode by the dynamic termination mode signal MD_DODT or entering a high-frequency mode by the high-frequency mode signal HF_MR. The buffer control circuit 213_1 may generate the first buffer enable signal BF_ON1 that is deactivated at a time point when a preset buffer control period elapses when a read operation on the first rank 133B is performed and the read command RD_C is generated. The buffer control period may be set in consideration of a period in which the first read strobe signal RDQS1 is received in order to calibrate the termination resistance value. The buffer control circuit 213_1 may be connected to the buffer circuit 213_3 to apply the first buffer enable signal BF_ON1 to the buffer circuit 213_3. The buffer circuit 213_3 may receive the first read strobe signal RDQS1 based on the first buffer enable signal BF_ON1 to generate a first internal read strobe signal IRDQS1. The buffer circuit 213_3 may buffer the first read strobe signal RDQS1 to generate the first internal read strobe signal IRDQS1 when the first buffer enable signal BF_ON1 is activated. The buffer circuit 213_3 may be connected to the read strobe signal detection circuit 213_5 to apply the first internal read strobe signal IRDQS1 to the read strobe signal detection circuit 213_5. The read strobe signal detection circuit 213_5 may generate the first dynamic control signal D_CTR1 based on the first internal read strobe signal IRDQS1. More specifically, the read strobe signal detection circuit 213_5 may generate the first dynamic control signal D_CTR1 that is activated when the first internal read strobe signal IRDQS1 is set to have a preset logic level. For example, the read strobe signal detection circuit 213_5 may generate the first dynamic control signal D_CTR1 that is activated when the first internal read strobe signal IRDQS1 is set to have a logic "high" level. The logic level of the first internal read strobe signal IRDQS1 set to activate the first dynamic control signal D_CTR1 may be variously set according to embodiments. The read strobe signal detection circuit 213_5 may be connected to the termination control circuit 215 to apply the first dynamic control signal D_CTR1 to the termination control circuit 215.

The termination control circuit 215 may generate a first termination resistance calibration signal ODT_S1 to calibrate a termination resistance value of the termination circuit 217, based on the first command control signal C_CTR1 that is received from the command detection circuit 211_5 and the first dynamic control signal D_CTR1 that is received from the read strobe signal detection circuit 213_5. The termination control circuit 215 may generate the first termination resistance calibration signal ODT_S1 for calibrating the termination resistance value of the termination circuit 217 to a target resistance value T_ODT when the first command control signal C_CTR1 is activated and the first dynamic control signal D_CTR1 is deactivated. The termination control circuit 215 may generate the first termination resistance calibration signal ODT_S1 for calibrating the termination resistance value of the termination circuit 217 to a dynamic resistance value D_ODT when the first command control signal C_CTR1 is deactivated and the first dynamic control signal D_CTR1 is activated. The termination control circuit 215 may generate the first termination resistance calibration signal ODT_S1 for calibrating the termination resistance value of the termination circuit 217 to a non-target resistance value NT_ODT when the first command control signal C_CTR1 is deactivated and the first dynamic control signal D_CTR1 is deactivated. The termination resistance value of the termination circuit 217 may be implemented to be set to one of the target resistance value T_ODT, the dynamic resistance value D_ODT, and the non-target resistance value NT_ODT by calibrating the logic bit set of bits included in the first termination resistance calibration signal ODT_S1 or by calibrating a voltage level of the first termination resistance calibration signal ODT_S1.

Figure 8:
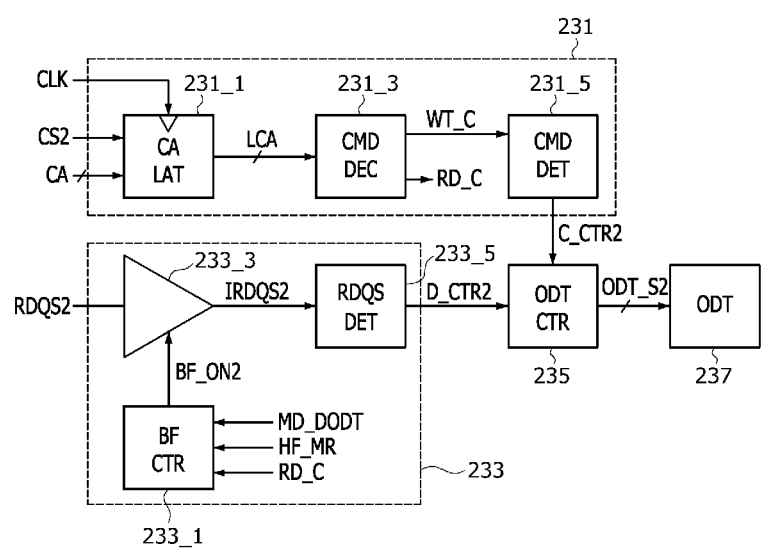
FIG. 8 is a block diagram illustrating a configuration of a second rank according to another embodiment of the present disclosure.

FIG. 8 is a block diagram illustrating a configuration of a second rank 135B according to another example of the second rank 135 shown in FIG. 1. As shown in FIG. 8, the second rank 135B may include a command control signal generation circuit 231, a dynamic control signal generation circuit 233, a termination control circuit 235, and a termination circuit 237.

The command control signal generation circuit 231 may generate a second command control signal C_CTR2 that is activated when a write operation of the second rank 135B is performed. To this end, the command control signal generation circuit 231 may include a command address latch circuit (CA LAT) 231_1, a command decoder (CMD DEC) 231_3, and a command detection circuit (CMD DET) 231_5. The command address latch circuit 231_1 may generate a latch command address LCA from a command address CA based on a clock CLK and a second chip selection signal CS2. The command address latch circuit 231_1 may latch the command address CA in synchronization with the clock CLK and may output the latched command address CA as the latch command address LCA when the second chip selection signal CS2 is activated for various internal operations including a write operation and a read operation of the second rank 135B. The command decoder 231_3 may generate a write command WT_C and a read command RD_C from the latch command address LCA that is received from the command address latch circuit 231_1. The command decoder 231_3 may decode the latch command address LCA to generate the write command WT_C for a write operation of the second rank 135B and may generate the read command RD_C for a read operation of the second rank 135B. The command decoder 231_3 may be connected to the command detection circuit 231_5 and the buffer control signal generation circuit (BF CTR) 233_1 to apply the write command WT_C to the command detection circuit 231_5 and to apply the read command RD_C to the buffer control signal generation circuit 233_1. The command detection circuit 231_5 may generate a second command control signal C_CTR2 based on the write command WT_C. The command detection circuit 231_5 may generate the second command control signal C_CTR2 that is activated when the write command WT_C is generated for the write operation of the second rank 135B. The command detection circuit 231_5 may be connected to the termination control circuit 235 to apply the second command control signal C_CTR2 to the termination control circuit 235.

The dynamic control signal generation circuit 233 may generate a second dynamic control signal D_CTR2 that is enabled to set a termination resistance value of the second rank 135B to a preset dynamic resistance value D_ODT based on a second read strobe signal RDQS2 in a state in which the write operation of the first rank 133B is performed and the dynamic termination mode or the high-frequency mode is entered. To this end, the dynamic control signal generation circuit 233 may include a buffer control circuit (BF_CTR) 233_1, a buffer circuit 233_3, and a read strobe signal detection circuit (RDQS DET) 233_5. The buffer control circuit 233_1 may generate a second buffer enable signal BF_ON2 based on a dynamic termination mode signal MD_DODT, a high-frequency mode signal HF_MR, and a read command RD_C. The buffer control circuit 233_1 may generate the second buffer enable signal BF_ON2 that is activated when entering a dynamic termination mode by the dynamic termination mode signal MD_DODT or when entering a high-frequency mode by the high-frequency mode signal HF_MR. The buffer control circuit 233_1 may generate the second buffer enable signal BF_ON2 that is deactivated at a time point when a preset buffer control period elapses when the read operation for the second rank 135B is performed and the read command RD_C is generated. The buffer control circuit 233_1 may be connected to the buffer circuit 233_3 to apply the second buffer enable signal BF_ON2 to the buffer circuit 233_3. The buffer circuit 233_3 may receive the second read strobe signal RDQS2 based on the second buffer enable signal BF_ON2 to generate a second internal read strobe signal IRDQS2. The buffer circuit 233_3 may buffer the second read strobe signal RDQS2 to generate the second internal read strobe signal IRDQS2 when the second buffer enable signal BF_ON2 is activated. The buffer circuit 233_3 may be connected to the read strobe signal detection circuit 233_5 to apply the second internal read strobe signal IRDQS2 to the read strobe signal detection circuit 233_5. The read strobe signal detection circuit 233_5 may generate the second dynamic control signal D_CTR2 based on the second internal read strobe signal IRDQS2. More specifically, the read strobe signal detection circuit 233_5 may generate the second dynamic control signal D_CTR2 that is activated when the second internal read strobe signal IRDQS2 is set to have a preset logic level. For example, the read strobe signal detection circuit 233_5 may generate the second dynamic control signal D_CTR2 that is activated when the second internal read strobe signal IRDQS2 is set to have a logic "high" level. The logic level of the second internal read strobe signal IRDQS2 that is set to activate the second dynamic control signal D_CTR2 may be variously set according to embodiments. The read strobe signal detection circuit 233_5 may be connected to the termination control circuit 235 to apply the second dynamic control signal D_CTR2 to the termination control circuit 235.

The termination control circuit 235 may generate a second termination resistance calibration signal ODT_S2 to calibrate a termination resistance value of the termination circuit 237 based on the second command control signal C_CTR2 received from the command detection circuit 231_5 and the second dynamic control signal D_CTR2 received from the read strobe signal detection circuit 233_5. The termination control circuit 235 may generate the second termination resistance calibration signal ODT_S2 to calibrate the termination resistance value of the termination circuit 237 to a target resistance value T_ODT when the second command control signal C_CTR2 is activated and the second dynamic control signal D_CTR2 is deactivated. The termination control circuit 235 may generate the second termination resistance calibration signal ODT_S2 to calibrate the termination resistance value of the termination circuit 237 to a dynamic resistance value D_ODT when the second command control signal C_CTR2 is deactivated and the second dynamic control signal D_CTR2 is activated. The termination control circuit 235 may generate the second termination resistance calibration signal ODT_S2 to calibrate the termination resistance value of the termination circuit 237 to a non-target resistance value NT_ODT when the second command control signal C_CTR2 is deactivated and the second dynamic control signal D_CTR2 is deactivated. The termination resistance value of the termination circuit 237 may be implemented to be set to one of the target resistance value T_ODT, the dynamic resistance value D_ODT, and the non-target resistance value NT_ODT by calibrating the logic bit set of bits included in the second termination resistance calibration signal ODT_S2 or by calibrating the voltage level of the termination resistance calibration signal ODT_S1.

Figure 9:
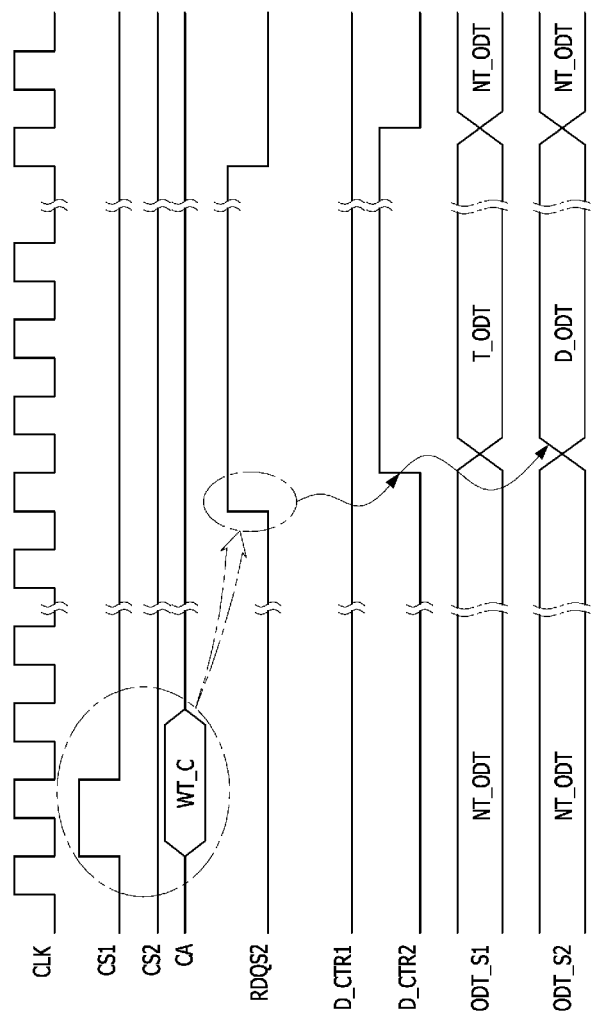
FIG. 9 is a timing diagram illustrating an operation in which a termination resistance value is calibrated in a semiconductor system according to another embodiment of the present disclosure.

FIG. 9 is a timing diagram illustrating an operation in which a termination resistance value is calibrated in a semiconductor system according to another embodiment of the present disclosure. Referring to FIG. 9, when a write operation for the first rank 133B shown in FIG. 7 is performed, the write operation may proceed as follows.

As shown in FIG. 9, when a first chip selection signal CS1 is activated at a logic "high" level, a write command WT_C is generated from a command address CA in synchronization with a clock CLK, and the write operation for the first rank 133B is performed, a first termination resistance calibration signal ODT_S1 for setting a termination resistance value of the first rank 133B to a preset target resistance value T_ODT may be generated.

Meanwhile, as shown in FIGS. 8 and 9, when the write operation on the first rank 1338 is performed and a second read strobe signal RDQS2 set to have a logic "high" level is received, a second dynamic control signal D_CTR2 that is activated at a logic "high" level may be generated. When the second dynamic control signal D_CTR2 is activated at a logic "high" level, a second termination resistance calibration signal ODT_S2 may be generated for setting a termination resistance value of a second rank 1358 to a preset dynamic resistance value D_ODT.

Figure 10:
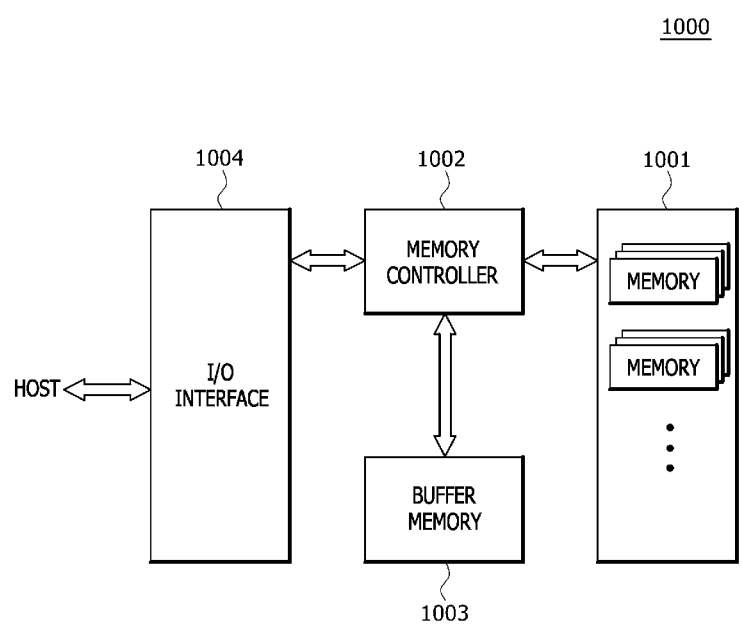
FIG. 10 is a block diagram illustrating a configuration of an electronic system according to an embodiment of the present disclosure.

The semiconductor system 1 described above in FIG. 1 may be applied to an electronic system including a memory system, a graphic system, a computing system, and a mobile system. For example, referring to FIG. 10, an electronic system 1000 according to an embodiment of the present disclosure may include a data storage 1001, a memory controller 1002, a buffer memory 1003, and an input/output (I/O) interface 1004.

The data storage 1001 may store data (not shown) that is applied from the memory controller 1002 according to a control signal from the memory controller 1002, and may read out stored data (not shown) to output the data to the memory controller 1002. Meanwhile, the data storage 1001 may include non-volatile memory devices capable of continuously storing data without losing data even when power is cut off. The non-volatile memory device may include a flash memory device (NOR flash memory device, NAND flash memory device), a phase change random access memory (PRAM) device, a resistive random access memory (RRAM) device, a spin transfer torque random access memory (STTRAM) device, or a magnetic random access memory (MRAM) device.

The memory controller 1002 may decode instructions applied from an external device (a host device) through the I/O interface 1004, and may control data input and output for the data storage 1001 and the buffer memory 1003 according to a decoding result. Although the memory controller 1002 is represented as one block in FIG. 10, a controller for controlling the data storage 1001 and a controller for controlling the buffer memory 1003 which is a volatile memory device may be configured independently in the memory controller 1002. The memory controller 1002 may include the controller 11 described above with reference to FIG. 1.

The buffer memory 1003 may temporarily store data to be processed by the memory controller 1002, that is, the data (not shown) that is input or output to or from the data storage 1001. The buffer memory 1003 may store data (not shown) applied from the memory controller 1002 according to a control signal. The buffer memory 1003 may include the semiconductor device 13 described above with reference to FIG. 1. The buffer memory 1003 may read out stored data to output the data to the memory controller 1002. The buffer memory 1003 may include a volatile memory device such as a dynamic random access memory (DRAM) device, a mobile DRAM device, or a static random access memory (SRAM) device.

The I/O interface 1004 may provide physical connection between the memory controller 1002 and an external device (a host device) to enable the memory controller 1002 to receive a control signal for data input/output from the external device and to exchange data with the external device. The I/O interface 1004 may include one of various interface protocols such as universal serial bus (USB), multi-media card (MMC), peripheral component interconnect-express (PCI-E), serial attached SCSI (SAS), serial ATA (SATA), parallel ATA (PATA), small computer system interface (SCSI), enhanced small disk interface (ESDI), integrated drive electronics (IDE), and the like.

The electronic system 1000 may be used as an auxiliary storage device of a host device or an external storage device. The electronic system 1000 may include a solid state disk (SSD), a universal serial bus (USB) memory, a secure digital (SD) card, a mini secure digital (mSD) card, a micro secure digital (micro SD) card, secure digital high capacity (SDHC), a memory stick card, a smart media (SM) card, a multimedia card (MMC), an embedded multimedia card (eMMC), a compact flash (CF) card, and the like.

Figure 11:
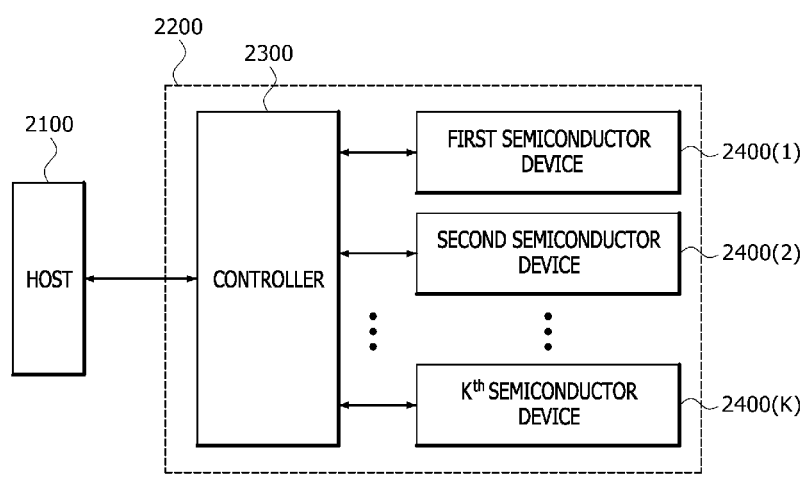
FIG. 11 is a block diagram illustrating a configuration of an electronic system according to another embodiment of the present disclosure.

FIG. 11 is a block diagram illustrating a configuration of an electronic system 2000 according to another embodiment of the present disclosure. As shown in FIG. 11, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may include the controller 11 described above with reference FIG. 1. Each of the semiconductor devices 2400 (1:K) may include the semiconductor device 13 described above with reference to FIG. 1. Each of the semiconductor devices 2400(1:K) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM) device.

Figure 12:
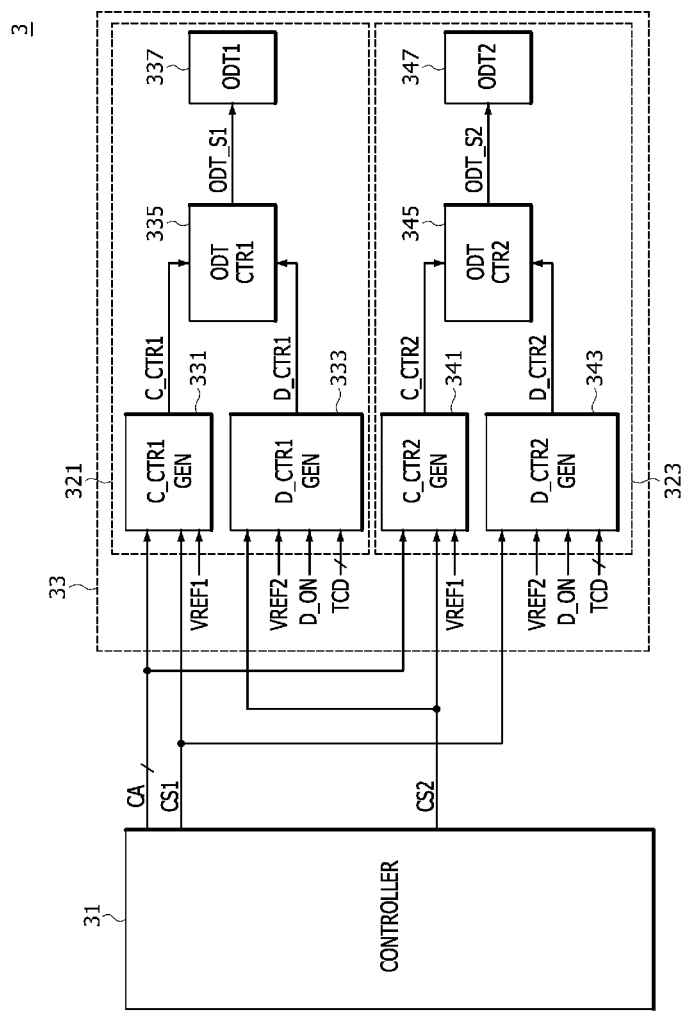
FIG. 12 is a block diagram illustrating a configuration of a semiconductor system according to an embodiment of the present disclosure.

FIG. 12 is a block diagram illustrating a configuration of a semiconductor system 3 according to an embodiment of the present disclosure. As shown in FIG. 12, the semiconductor system 3 may include a controller 31 and a semiconductor device 33.

The controller 31 may transmit a command address CA, a first chip selection signal CS1, and a second chip selection signal CS2 to the semiconductor device 33. The command address CA may include a command for performing internal operations including a write operation, a read operation, and the like, and an address including a bank address, a row address, a column address, and the like. The controller 31 may output the first chip selection signal CS1 and the second chip selection signal CS2 to the semiconductor device 33 to set a resistance value of a termination resistor of each of a first rank 321 and a second rank 322. As an example, when a write operation on the first rank 321 is performed, in order to set the resistance value of the termination resistor of the first rank 321 to a target resistance value (T_ODT in FIG. 15) and to set the resistance value of the termination resistor of the second rank 323 to a dynamic resistance value (D_ODT in FIG. 15), the controller 31 may supply the first chip selection signal CS1 including a pulse that is driven at a first voltage level to the semiconductor device 33. Here, the first voltage level may be set to be equal to or higher than a second reference voltage, and the second reference voltage may be set to be higher than a first reference voltage. In another example, when the write operation on the first rank 321 is performed, in order to set the resistance value of the termination resistor of the first rank 321 to the target resistance value (T_ODT in FIG. 15), the controller 31 may supply the first chip selection signal CS1 including a pulse that is driven to a second voltage level to the semiconductor device 33. Here, the second voltage level may be set to be equal to or higher than the first reference voltage and less than the second reference voltage. In yet another example, when a write operation on the second rank 323 is performed, in order to set the resistance value of the termination resistor of the second rank 323 to the target resistance value (T_ODT in FIG. 15) and to set the resistance value of the termination resistor of the first rank 321 to the dynamic resistance value (D_ODT in FIG. 15), the controller 31 may supply the second chip selection signal CS2 including a pulse that is driven to the first voltage level to the semiconductor device 33. As further another example, when the write operation on the second rank 323 is performed, in order to set the resistance value of the termination resistor of the second rank 323 to the target resistance value (T_ODT in FIG. 15), the controller 31 may supply the second chip selection signal CS2 including a pulse that is driven to the second voltage level to the semiconductor device 33.

The semiconductor device 33 may include the first rank 321 and the second rank 323. When the first chip selection signal CS1 including a pulse that is driven to the first voltage level or the second voltage level is received for the write operation on the first rank 321, the first rank 321 may calibrate the termination resistance value to the target resistance value (T_ODT in FIG. 15). When the second chip selection signal CS2 including the pulse that is driven to the first voltage level or the second voltage level is received for the write operation on the second rank 323, the first rank 321 may calibrate the termination resistance value to the dynamic resistance value (D_ODT in FIG. 15).

Figure 15:
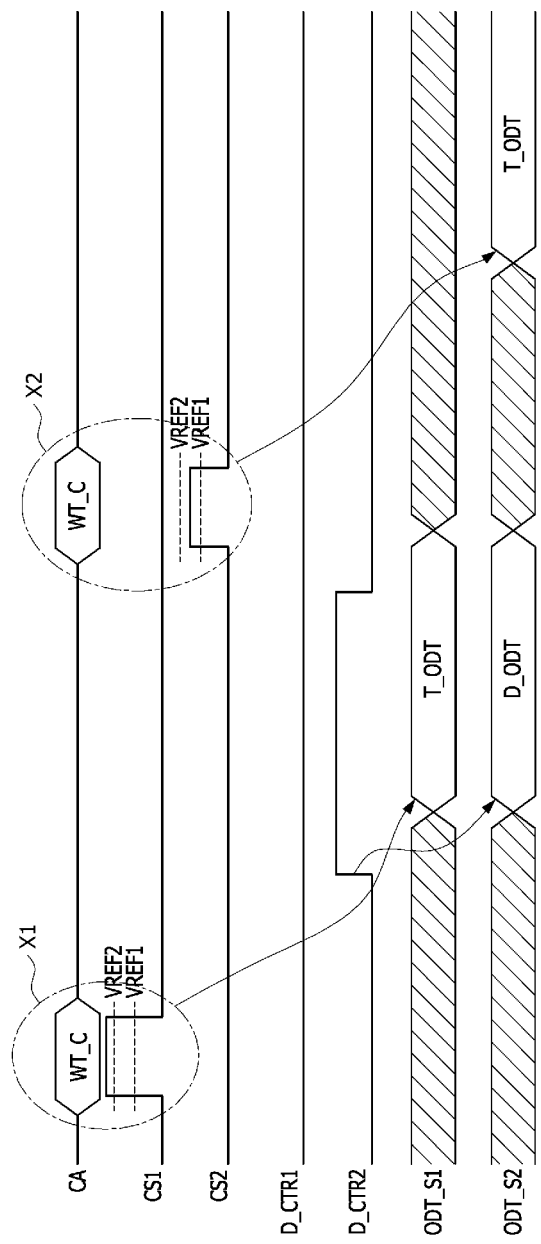
FIG. 15 is a timing diagram illustrating an operation of calibrating a termination resistance value in the semiconductor system shown in FIG. 12.

When the second chip selection signal CS2 including the pulse that is driven to the first voltage level or the second voltage level is received for the write operation on the second rank 323, the second rank 323 may calibrate the termination resistance value to the target resistance value (T_ODT in FIG. 15). When the first chip selection signal CS1 including the pulse that is driven to the first voltage level is received for the write operation on the first rank 321, the second rank 323 may calibrate the termination resistance value to the dynamic resistance value (D_ODT in FIG. 15).

The first rank 321 may include a first command control signal generation circuit 331, a first dynamic control signal generation circuit 333, a first termination control circuit 335, and a first termination circuit 337.

The first command control signal generation circuit 331 may generate a first command control signal C_CTR1 based on the command address CA, the first chip selection signal CS1, and the first reference voltage VREF1. The first command control signal generation circuit 331 may generate the first command control signal C_CTR1 that is activated when a write command (WT_C in FIG. 15) is input through the command address CA to perform the write operation on the first rank 321 in a state in which the first chip selection signal CS1 including a pulse that is driven to a voltage level equal to or higher than the first reference voltage VREF1 is received. The first command control signal generation circuit 331 may generate the first command control signal C_CTR1 that is activated when the write command (WT_C in FIG. 15) is input through the command address CA to perform the write operation on the first rank 321 in a state in which the first chip selection signal CS1 including the pulse that is driven to the first voltage level or the second voltage level is received. The first command control signal generation circuit 331 may be connected to the first termination control circuit 335 to apply the first command control signal C_CTR1 to the first termination control circuit 335. According to embodiments, the first reference voltage VREF1 may be internally generated and supplied to the semiconductor device 33 or may be supplied by the controller 31.

The first dynamic control signal generation circuit 333 may generate a first dynamic control signal D_CTR1 based on the second chip selection signal CS2, the second reference voltage VREF2, a dynamic activation signal D_ON, and a timing code TCD. The first dynamic control signal generation circuit 333 may compare the second chip selection signal CS2 with the second reference voltage VREF2 when the dynamic activation signal D_ON is activated and may output a comparison result as the first dynamic control signal D_CTR1 at a timing set according to the timing code TCD. The first dynamic control signal generation circuit 333 may output the activated first dynamic control signal D_CTR1 at the timing set according to the timing code TCD when the dynamic activation signal D_ON is activated and the second chip selection signal CS2 including a pulse that is driven to a voltage level equal to or higher than the second reference voltage VREF2 is received. According to embodiments, the dynamic activation signal D_ON and the timing code TCD may be internally generated and supplied to the semiconductor device 33 based on a mode register set operation or a fuse cutting operation or may be supplied by the controller 31. According to embodiments, the second reference voltage VREF2 may be internally generated and supplied to the semiconductor device 33 or may be supplied by the controller 31. The first dynamic control signal generation circuit 333 may be connected to the first termination control circuit 335 to apply the first dynamic control signal D_CTR1 to the first termination control circuit 335.

The first termination control circuit 335 may generate a first termination resistance calibration signal ODT_S1 to calibrate the termination resistance value of the first termination circuit 337 based on the first command control signal C_CTR1 received from the first command control signal generation circuit 331 and the first dynamic control signal D_CTR1 received from the first dynamic control signal generation circuit 333. When the first command control signal C_CTR1 is activated and the first dynamic control signal D_CTR1 is deactivated, the first termination control circuit 335 may generate the first termination resistance calibration signal ODT_S1 to calibrate the termination resistance value of the first termination circuit 337 to the target resistance value (T_ODT of FIG. 15). When the first command control signal C_CTR1 is deactivated and the first dynamic control signal D_CTR1 is activated, the first termination control circuit 335 may generate the first termination resistance calibration signal ODT_S1 to calibrate the termination resistance value of the first termination circuit 337 to the dynamic resistance value (D_ODT of FIG. 15). The termination resistance value of the first termination circuit 337 may be set to a resistance value of the termination resistor (not shown) provided in the first rank 321. By calibrating a logic bit set of the bits included in the first termination resistance calibration signal ODT_S1 or by calibrating the voltage level of the first termination resistance calibration signal ODT_S1, the termination resistance value of the first termination circuit 337 may be set to the target resistance value (T_ODT in FIG. 15) or the dynamic resistance value (D_ODT in FIG. 15).

The second rank 323 may include a second command control signal generation circuit 341, a second dynamic control signal generation circuit 343, a second termination control circuit 345, and a second termination circuit 347.

The second command control signal generation circuit 341 may generate a second command control signal C_CTR2 based on the command address CA, the second chip selection signal CS2, and the first reference voltage VREF1. The second command control signal generation circuit 341 may generate the second command control signal C_CTR2 that is activated when the write command (WT_C in FIG. 15) is input through the command address CA to perform the write operation on the second rank 323 in a state in which the second chip selection signal CS2 including a pulse that is driven to a voltage level equal to or higher than the first reference voltage VREF1 is received. The second command control signal generation circuit 341 may generate the second command control signal C_CTR2 that is activated when the write command (WT_C in FIG. 15) is input through the command address CA to perform the write operation on the second rank 323 in a state in which the second chip selection signal CS2 including a pulse that is driven to the first voltage level or the second voltage level is received. The second command control signal generation circuit 341 may be connected to the second termination control circuit 345 to apply the second command control signal C_CTR2 to the second termination control circuit 345.

The second dynamic control signal generation circuit 343 may generate the first dynamic control signal D_CTR1 based on the second chip selection signal CS2, the second reference voltage VREF2, the dynamic activation signal D_ON, and the timing code TCD. The second dynamic control signal generation circuit 343 may compare the first chip selection signal CS1 with the second reference voltage VREF2 when the dynamic activation signal D_ON is activated and may output a comparison result as the second dynamic control signal D_CTR2 at a timing set according to the timing code TCD. The second dynamic control signal generation circuit 343 may output the activated second dynamic control signal D_CTR2 at the timing set according to the timing code TCD when the dynamic activation signal D_ON is activated and the first chip selection signal CS1 including a pulse that is driven to a voltage level equal to or higher than the second reference voltage VREF2 is received. The second dynamic control signal generation circuit 343 may be connected to the second termination control circuit 345 to apply the second dynamic control signal D_CTR2 to the second termination control circuit 345.

The second termination control circuit 345 may generate a second termination resistance calibration signal ODT_S2 to calibrate a termination resistance value of the second termination circuit 347 based on the second command control signal C_CTR2 received from the second command control signal generation circuit 341 and the second dynamic control signal D_CTR2 received from the second dynamic control signal generation circuit 343. When the second command control signal C_CTR2 is activated and the second dynamic control signal D_CTR2 is deactivated, the second termination control circuit 345 may generate the second termination resistance calibration signal ODT_S2 to calibrate the termination resistance value of the second termination circuit 347 to the target resistance value (T_ODT of FIG. 15). When the second command control signal C_CTR2 is deactivated and the second dynamic control signal D_CTR2 is activated, the second termination control circuit 345 may generate the second termination resistance calibration signal ODT_S2 to calibrate the termination resistance value of the second termination circuit 347 to the dynamic resistance value (D_ODT of FIG. 15). The termination resistance value of the second termination circuit 347 may be set to a resistance value of a termination resistor (not shown) provided in the second rank 323. By calibrating the logic bit set of the bits included in the second termination resistance calibration signal ODT_S2 or by calibrating the voltage level of the second termination resistance calibration signal ODT_S2, the termination resistance value of the second termination circuit 347 may be set to the target resistance value (T_ODT in FIG. 15) or the dynamic resistance value (D_ODT in FIG. 15).

Figure 13:
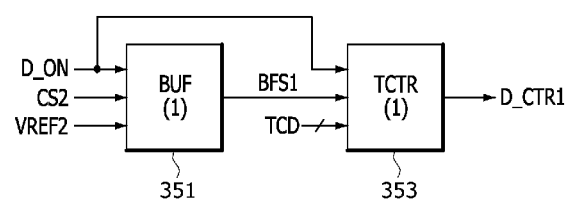
FIG. 13 is a block diagram illustrating a configuration according to an embodiment of a first dynamic control circuit included in the semiconductor system shown in FIG. 12.

FIG. 13 is a block diagram illustrating a configuration of a first dynamic control circuit 333A according to an embodiment of the first dynamic control circuit 333, shown in FIG. 12. As shown in FIG. 13, the first dynamic control circuit 333A may include a first buffer circuit (BUF(1)) 351 and a first timing control circuit (TCTR(1)) 353.

The first buffer circuit 351 may generate a first buffer signal BFS1 based on the second chip selection signal CS2, the second reference voltage VREF2, and the dynamic activation signal D_ON. The first buffer circuit 351 may generate the first buffer signal BFS1 that is activated when the second chip selection signal CS2 including a pulse that is driven to a voltage level equal to or higher than the second reference voltage VREF2 is received in a state in which the dynamic enable signal D_ON is activated. The first buffer circuit 351 may be connected to the first timing control circuit 353 to supply the first buffer signal BFS1 to the first timing control circuit 353.

The first timing control circuit 353 may generate the first dynamic control signal D_CTR1 based on the dynamic activation signal D_ON, the first buffer signal BFS1, and the timing code TCD. The first timing control circuit 353 may output the activated first dynamic control signal D_CTR1 at the timing set according to the timing code TCD when the activated first buffer signal BFS1 is received in a state in which the dynamic activation signal D_ON is activated.

Figure 14:
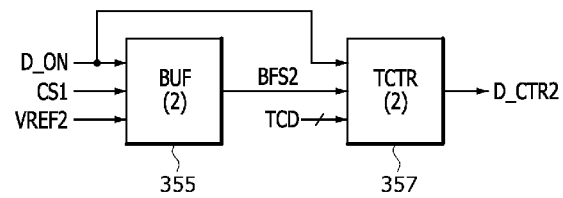
FIG. 14 is a block diagram illustrating a configuration according to an embodiment of a second dynamic control circuit included in the semiconductor system shown in FIG. 12.

FIG. 14 is a block diagram illustrating a configuration of a second dynamic control circuit 343A according to an embodiment of the second dynamic control circuit 343, shown in FIG. 12. As shown in FIG. 14, the second dynamic control circuit 343A may include a second buffer circuit (BUF(2)) 355 and a second timing control circuit (TCTR(2)) 357.

The second buffer circuit 355 may generate a second buffer signal BFS2 based on the first chip selection signal CS1, the second reference voltage VREF2, and the dynamic activation signal D_ON. The second buffer circuit 355 may generate the second buffer signal BFS2 that is activated when the first chip selection signal CS1 including a pulse that is driven to a voltage level equal to or higher than the second reference voltage VREF2 is received in a state in which the dynamic enable signal D_ON is activated. The second buffer circuit 355 may be connected to the second timing control circuit 357 to supply the second buffer signal BFS2 to the second timing control circuit 357.

The second timing control circuit 357 may generate the second dynamic control signal D_CTR2 based on the dynamic activation signal D_ON, the second buffer signal BFS2, and the timing code TCD. The second timing control circuit 357 may output the activated second dynamic control signal D_CTR2 at the timing set according to the timing code TCD when the activated second buffer signal BFS2 is received in a state in which the dynamic activation signal D_ON is activated.

FIG. 15 is a timing diagram illustrating an operation of calibrating a termination resistance value in the semiconductor system 3, shown in FIG. 12.

As shown in X1 of FIG. 15, when the write command WT_C is input through the command address CA and a write operation for the first rank 321 is performed in a state in which the first chip selection signal CS1 including the pulse that is driven to the first voltage level, that is, a voltage level equal to or higher than the second reference voltage VREF2 is received, the second dynamic control signal D_CTR2 for setting the termination resistance value of the first rank 321 to the target resistance value T_ODT and setting the termination resistance value of the second rank 323 to the dynamic resistance value D_ODT may be generated.

As shown in X2 of FIG. 15, when the write command WT_C is input through the command address CA and the write operation for the second rank 323 is performed in a state in which the second chip selection signal CS2 including a pulse that is driven to a second voltage level, that is, a voltage level equal to or higher than the first reference voltage VREF1 and lower than the second reference voltage VREF2 is received, the termination resistance value of the second rank 323 may be set as the target resistance value T_ODT.

Figure 16:
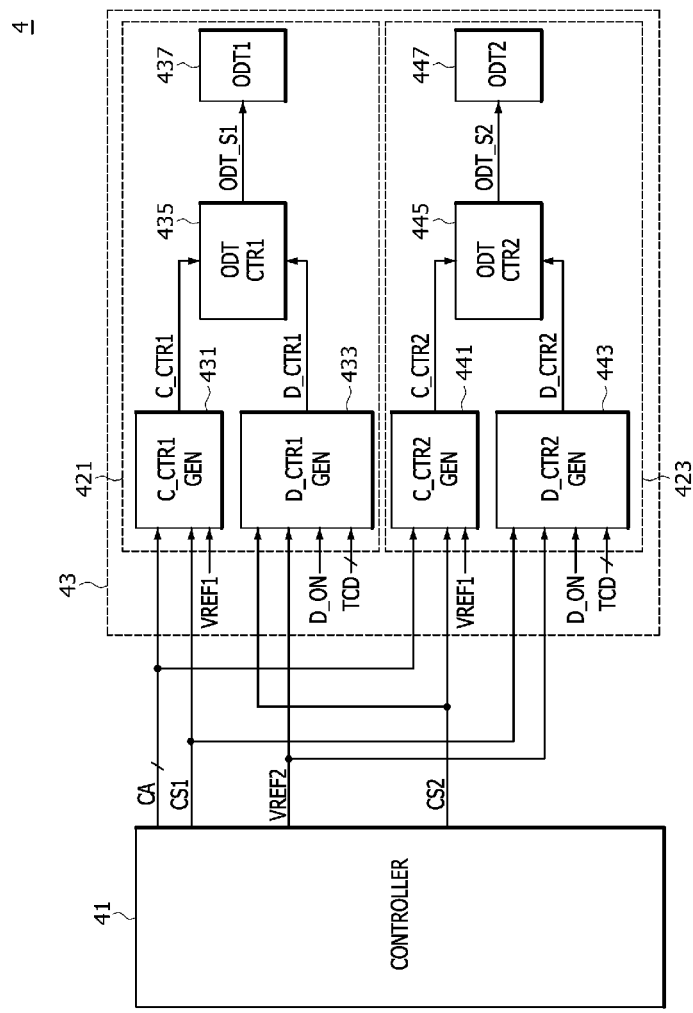
FIG. 16 is a block diagram illustrating a configuration of a semiconductor system according to another embodiment of the present disclosure.

FIG. 16 is a block diagram illustrating a configuration of a semiconductor system 4 according to another embodiment of the present disclosure. As shown in FIG. 16, the semiconductor system 4 may include a controller 41 and a semiconductor device 43.

The controller 41 may output a command address CA, a first chip selection signal CS1, a second reference voltage VREF2, and a second chip selection signal CS2 to the semiconductor device 43. The controller 41 may be implemented in the same manner as the controller 31, described above with reference to FIG. 12, except for transmitting the second reference voltage VREF2 to the semiconductor device 43. Accordingly, a detailed description of the controller 41 has been omitted.

The semiconductor device 43 may include a first rank 421 and a second rank 423. The first rank 421 may include a first command control signal generation circuit 431, a first dynamic control signal generation circuit 433, a first termination control circuit 435, and a first termination circuit 437. The first rank 421 may be implemented in the same manner as the first rank 321 including the first command control signal generation circuit 331, the first dynamic control signal generation circuit 333, the first termination control circuit 335, and the first termination circuit 337, described above with reference to FIG. 12, except that the first dynamic control signal generation circuit 433 receives the second reference voltage VREF2 from the controller 41. Accordingly, a detailed description of the first rank 421 has been omitted. The second rank 423 may include a second command control signal generation circuit 441, a second dynamic control signal generation circuit 443, a second termination control circuit 445, and a second termination circuit 447. The second rank 423 may be implemented in the same manner as the second rank 323 including the second command control signal generation circuit 341, the second dynamic control signal generation circuit 343, the second termination control circuit 345, and the second termination circuit 347, described above with reference to FIG. 12, except that the second dynamic control signal generation circuit 443 receives the second reference voltage VREF2 from the controller 41. Accordingly, a detailed description of the second rank 423 has been omitted.

Figure 17:
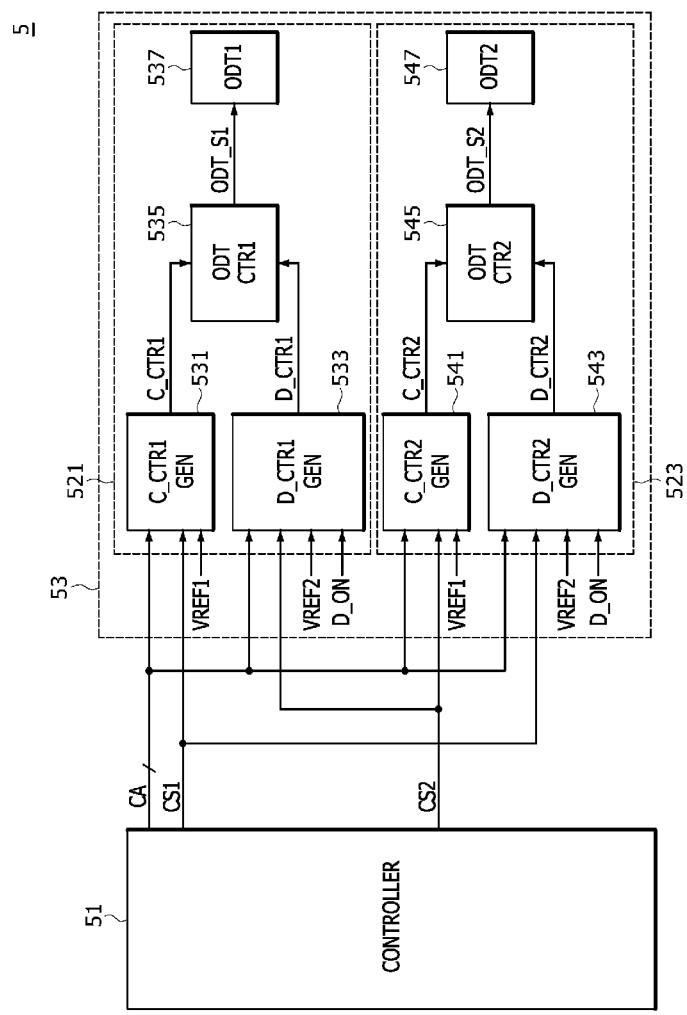
FIG. 17 is a block diagram illustrating a configuration of a semiconductor system according to further another embodiment of the present disclosure.

FIG. 17 is a block diagram illustrating a configuration of a semiconductor system 5 according to yet another embodiment of the present disclosure. As shown in FIG. 17, the semiconductor system 5 may include a controller 51 and a semiconductor device 53.

The controller 51 may output a command address CA, a first chip selection signal CS1, and a second chip selection signal CS2 to the semiconductor device 53. The controller 51 may be implemented in the same manner as the controller 31 described above with reference to FIG. 12, and accordingly, a detailed description of the controller 51 has been omitted.

The semiconductor device 53 may include a first rank 521 and a second rank 523. The first rank 521 may include a first command control signal generation circuit 531, a first dynamic control signal generation circuit 533, a first termination control circuit 535, and a first termination circuit 537. The first dynamic control signal generation circuit 533 may receive the command address CA from the controller 51 and may calibrate the output timing of the first dynamic control signal D_CTR1, based on the command address CA. Based on the command address CA received from the controller 51, the first rank 521 may be implemented in the same manner as the first rank 321 including the first command control signal generation circuit 331, the first dynamic control signal generation circuit 333, the first termination control circuit 335, and the first termination circuit 337, described above with reference to FIG. 12, except that the first dynamic control signal generating circuit 533 calibrates the output timing of the first dynamic control signal D_CTR1. Accordingly, a detailed description of the first rank 521 has been omitted. The second rank 523 may include a second command control signal generation circuit 541, a second dynamic control signal generation circuit 543, a second termination control circuit 545, and a second termination circuit 547. The second dynamic control signal generation circuit 543 may receive the command address CA from the controller 51, and calibrate the output timing of the second dynamic control signal D_CTR2, based on the command address CA. Based on the command address CA received from the controller 51, the second rank 523 may be implemented in the same manner as the second rank 323 including the second command control signal generation circuit 341, the second dynamic control signal generation circuit 343, the second termination control circuit 345, and the second termination circuit 347, described above with reference to FIG. 12, except that the second dynamic control signal generating circuit 543 calibrates the output timing of the second dynamic control signal D_CTR2. Accordingly, a detailed description of the second rank 523 has been omitted.

Figure 18:
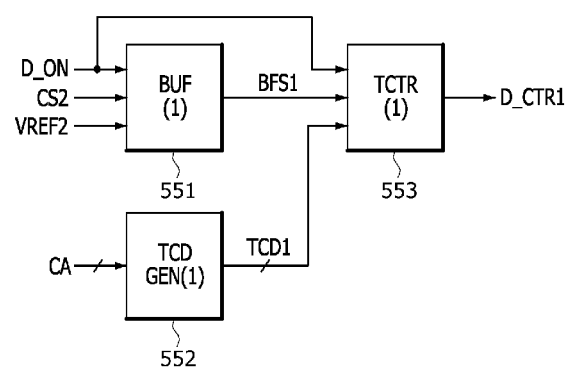
FIG. 18 is a block diagram illustrating a configuration according to an embodiment of a first dynamic control circuit included in the semiconductor system shown in FIG. 17.

FIG. 18 is a block diagram illustrating a configuration of a first dynamic control circuit 533A according to an embodiment of the first dynamic control circuit 533, shown in FIG. 17. As shown in FIG. 18, the first dynamic control circuit 533A may include a first buffer circuit (BUF(1)) 551, a first timing code generation circuit (TCD GEN(1)) 552, and a first timing control circuit (TCTR(1)) 553.

The first buffer circuit 551 may generate a first buffer signal BFS1 based on the second chip selection signal CS2, the second reference voltage VREF2, and the dynamic activation signal D_ON. The first buffer circuit 551 may generate the first buffer signal BFS1 that is activated when the second chip selection signal CS2 including a pulse that is driven to a voltage level equal to or higher than the second reference voltage VREF2 is received in a state in which the dynamic activation signal D_ON is activated. The first buffer circuit 551 may be connected to the first timing control circuit 553 to supply the first buffer signal BFS1 to the first timing control circuit 553.

The first timing code generation circuit 552 may generate a first timing code TCD1 based on the command address CA. The first timing code generation circuit 552 may extract the first timing code TCD1 from the command address CA. For example, the first timing code generation circuit 552 may decode some bits included in the command address CA to generate the first timing code TCD1. The first timing code generation circuit 552 may be connected to the first timing control circuit 553 to supply the first timing code TCD1 to the first timing control circuit 553.

The first timing control circuit 553 may generate the first dynamic control signal D_CTR1 based on the dynamic activation signal D_ON, the first buffer signal BFS1, and the first timing code TCD1. The first timing control circuit 553 may output the activated first dynamic control signal D_CTR1 at the timing set according to the first timing code TCD1 when the activated first buffer signal BFS1 is received in a state in which the dynamic activation signal D_ON is activated.

Figure 19:
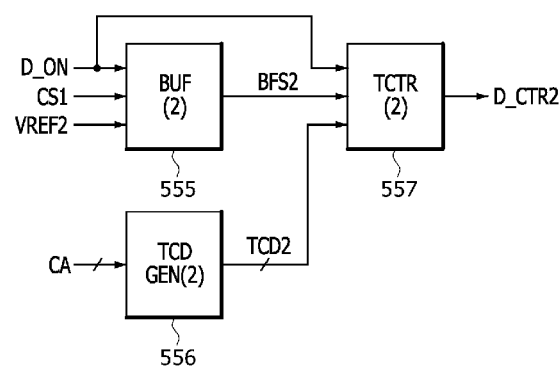
FIG. 19 is a block diagram illustrating a configuration according to an embodiment of a second dynamic control circuit included in the semiconductor system shown in FIG. 17.

FIG. 19 is a block diagram illustrating a configuration of a second dynamic control circuit 543A according to an embodiment of the second dynamic control circuit 543, shown in FIG. 17. As shown in FIG. 19, the second dynamic control circuit 543A may include a second buffer circuit (BUF(2)) 555, a second timing code generation circuit (TCD GEN(2)) 556, and a second timing control circuit (TCTR(2)) 557.

The second buffer circuit 555 may generate the second buffer signal BFS2 based on the first chip selection signal CS1, the second reference voltage VREF2, and the dynamic activation signal D_ON. The second buffer circuit 555 may generate the second buffer signal BFS2 that is activated when the first chip selection signal CS1 including a pulse that is driven to a voltage level equal to or higher than the second reference voltage VREF2 is received in a state in which the dynamic activation signal D_ON is activated. The second buffer circuit 555 may be connected to the second timing control circuit 557 to supply the second buffer signal BFS2 to the second timing control circuit 557.

The second timing code generation circuit 556 may generate the second timing code TCD2 based on the command address CA. The second timing code generation circuit 556 may extract the second timing code TCD2 from the command address CA. For example, the second timing code generation circuit 556 may decode some bits included in the command address CA to generate the second timing code TCD2. The second timing code generation circuit 556 may be connected to the second timing control circuit 557 to supply the second timing code TCD2 to the second timing control circuit 557.

The second timing control circuit 557 may generate the second dynamic control signal D_CTR2 based on the dynamic activation signal D_ON, the second buffer signal BFS2, and the timing code TCD. The second timing control circuit 557 may output the activated second dynamic control signal D_CTR2 at the timing set according to the timing code TCD when the activated second buffer signal BFS2 is received in a state in which the dynamic activation signal D_ON is activated.

Figure 20:
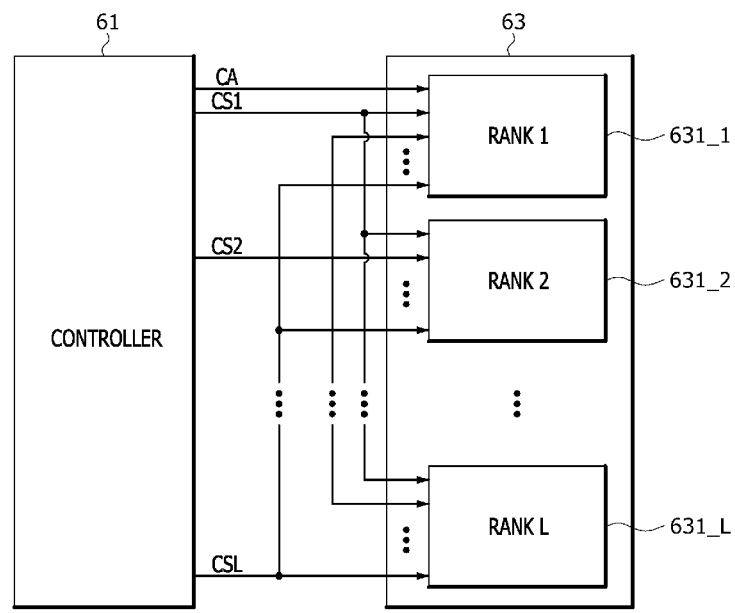
FIG. 20 is a block diagram illustrating a configuration of a semiconductor system according to further another embodiment of the present disclosure.

FIG. 20 is a block diagram illustrating a configuration of a semiconductor system 6 according to yet another embodiment of the present disclosure. As shown in FIG. 20, the semiconductor system 6 may include a controller 61 and a semiconductor device 63.

The controller 61 may output a command address CA and first to $L^{th}$ chip selection signals CS1 and CS2~CSL to the semiconductor device 63. The controller 61 may supply the first to $L^{th}$ chip selection signals CS1~CSL to the semiconductor device 63 to set a resistance value of a termination resistor of each of first to $L^{th}$ ranks 631_1 and 631_2~631_L. As an example, when a write operation on the first rank 631_1 is performed, the controller 61 may output the first chip selection signal CS1 including a pulse set to the first voltage level to the semiconductor device 63 to set the resistance value of the termination resistor of the first rank 631_1 to the target resistance value T_ODT and may output the first to $(L-1)^{th}$ chip selection signals CS1~CS(L-1), each set to a predetermined voltage level, to the semiconductor device 63 to set the resistance value of the termination resistor of the $L^{th}$ rank 631_L to the dynamic resistance value D_ODT. In another example, when a write operation on the $L^{th}$ rank 631_L is performed, the controller 61 may output the $L^{th}$ chip selection signal CSL including the pulse set to the first voltage level to the semiconductor device 63 to set the resistance value of the termination resistor of the $L^{th}$ rank 631_L to the target resistance value T_ODT and may output the second to $L^{th}$ chip selection signals CS2~CSL including pulses, each set to a preset voltage level, to the semiconductor device 63 to set the resistance value of the termination resistor of the first rank 631_1 to the dynamic resistance value D_ODT.

The semiconductor device 63 may include first to $L^{th}$ ranks 631_1 and 631_2~631_L. Each of the first to $L^{th}$ ranks 631_1 and 631_2~631_L may calibrate each termination resistance value to the target resistance value T_ODT when a write operation is performed in a state in which each of the first to $L^{th}$ chip selection signals CS1~CSL including pulses driven at the first voltage level is received. Based on voltage level combinations of some signals among the first to $L^{th}$ chip selection signals CS1~CSL, each of the first to $L^{th}$ ranks 631_1 and 631_2~631_L may calibrate the termination resistance value to the dynamic resistance value D_ODT when the write operation is not performed. For example, when the write operation on the first rank 631_1 is not performed, the first rank 631_1 may calibrate the termination resistance value of the first rank 631_1 to the dynamic resistance value D_ODT based on the voltage level combination of the pulses included in the second to $L^{th}$ chip selection signals CS2~CSL. In another example, when the write operation on the $L^{th}$ rank 631_L is not performed, the $L^{th}$ rank 631_L may calibrate the termination resistance value of the $L^{th}$ rank 631_L to the dynamic resistance value D_ODT based on the voltage level combination of the pulses included in the first to $(L-1)^{th}$ chip selection signals CS1~CS(L-1).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor system comprising:
   a controller configured to output a command address, a first chip selection signal, and a second chip selection signal; and
   a semiconductor device, including a first rank and a second rank, configured to receive the command address, the first chip selection signal, and the second chip selection signal and configured to calibrate a termination resistance value of the first rank based on the command address and the first chip selection signal and to calibrate a termination resistance value of the second rank based on the command address and the second chip selection signal;
   wherein the first rank calibrates the termination resistance value of the first rank to a first resistance value based on the command address and the first chip selection signal when a write operation is performed on the first rank;
   wherein the first rank calibrates the termination resistance value of the first rank to a second resistance value based on the second chip selection signal when a write operation is performed on the second rank;
   wherein the first resistance value is different from the second resistance value; and
   wherein a termination resistance value corresponds to a value that impedance matches a receiving end for data during the write operation.

2. The semiconductor system of claim 1, wherein, when a write command is generated from the command address in a state in which the first chip selection signal is received including a pulse driven to a voltage level equal to or higher than a first reference voltage, the first rank calibrates the termination resistance value of the first rank to the first resistance value.

3. The semiconductor system of claim 2, wherein, when a write operation is performed on the second rank and the second chip selection signal is received including a pulse driven to a voltage level equal to or higher than a second reference voltage, the first rank calibrates the termination resistance value of the second rank to the second resistance value.

4. The semiconductor system of claim 3, wherein the second reference voltage is higher than the first reference voltage.

5. The semiconductor system of claim 1, wherein the second rank calibrates the termination resistance value of the second rank to the first resistance value based on the command address and the second chip selection signal when the write operation is performed on the second rank.

6. The semiconductor system of claim 5, wherein, when a write command is generated from the command address in a state in which the second chip selection signal is received including a pulse driven to a voltage level equal to or higher than a first reference voltage, the second rank calibrates the termination resistance value of the second rank to the first resistance value.

7. The semiconductor system of claim 5, wherein, when the write operation is performed on the first rank, the second rank calibrates the termination resistance value of the second rank to the second resistance value based on the first chip selection signal.

8. The semiconductor system of claim 7, wherein, when the write operation is performed on the first rank and the first chip selection signal is received including a pulse driven to a voltage level equal to or higher than a second reference voltage is received, the second rank calibrates the termination resistance value of the second rank to the second resistance value.

9. The semiconductor system of claim 1, wherein the first rank includes:
   a first command control signal generation circuit configured to generate a first command control signal activated when the write operation is performed on the first rank based on the command address and the first chip selection signal;
   a first dynamic control signal generation circuit configured to generate a first dynamic control signal when the write operation is performed on the second rank based on the second chip selection signal; and
   a first termination control circuit configured to generate a first termination resistance calibration signal that calibrates the termination resistance value of the first rank based on the first command control signal and the first dynamic control signal.

10. The semiconductor system of claim 9, wherein the first dynamic control signal generation circuit includes a buffer circuit configured to generate a buffer signal that is activated based on a dynamic activation signal when the second chip selection signal is received including a pulse driven to a voltage level equal to or higher than the second reference voltage.

11. The semiconductor system of claim 10, wherein the buffer circuit receives the dynamic activation signal, an activation status determined based on a mode register set operation or a fuse cutting operation.

12. The semiconductor system of claim 10, wherein the first dynamic control signal generation circuit further includes a timing control circuit configured to generate a first dynamic control signal based on the dynamic activation signal and a timing code.

13. The semiconductor system of claim 9, wherein the first dynamic control signal generation circuit includes:
   a buffer circuit configured to generate a buffer signal activated when the second chip selection signal is received including a pulse driven to a voltage level equal to or higher than the second reference voltage based on the dynamic activation signal;
   a timing code generation circuit configured to generate a timing code based on the command address; and a timing control circuit configured to generate a first dynamic control signal based on the dynamic activation signal and the timing code.

14. The semiconductor system of claim 13, wherein the timing code generation circuit extracts the timing code based on some bits included in the command address.

15. The semiconductor system of claim 10, wherein the second rank includes:
a second command control signal generation circuit configured to, based on the command address and the second chip selection signal, generate a second command control signal activated when the write operation is performed on the second rank;
a second dynamic control signal generation circuit configured to, based on the first chip selection signal, generate a second dynamic control signal when the write operation is performed on the first rank; and
a second termination control circuit configured to, based on the second command control signal and the second dynamic control signal, generate a second termination resistance calibration signal that calibrates the termination resistance value of the second rank.

16. A semiconductor system comprising:
a controller configured to output a command address, a first chip selection signal, a second chip selection signal and a second reference voltage set to a voltage level greater than a first reference voltage; and
a semiconductor device, including a first rank and a second rank, configured to receive the command address, the first chip selection signal, and the second chip selection signal and configured to calibrate a termination resistance value of the first rank based on the command address and the first chip selection signal and to calibrate a termination resistance value of the second rank based on the command address and the second chip selection signal;
wherein the first rank calibrates the termination resistance value of the first rank to a first resistance value based on the command address and the first chip selection signal when a write operation is performed on the first rank;
wherein the first rank calibrates the termination resistance value of the first rank to a second resistance value based on the second chip selection signal when a write operation is performed on the second rank;
wherein the first resistance value is different from the second resistance value; and
wherein a termination resistance value corresponds to a value that impedance matches a receiving end for data during the write operation.

17. A semiconductor system comprising:
a controller configured to output a command address, a first chip selection signal, a second chip selection signal, and a third chip selection signal; and
a semiconductor device including a first rank, a second rank, and a third rank configured to receive the command address, the first chip selection signal, the second chip selection signal, and the third chip selection signal and configured to calibrate a termination resistance value of the first rank based on the command address and the first chip selection signal, to calibrate a termination resistance value of the second rank based on the command address and the second chip selection signal, and to calibrate a termination resistance value of the third rank based on the command address and the third chip selection signal;

wherein the first rank calibrates the termination resistance value of the first rank to a first resistance value based on the command address and the first chip selection signal when a write operation is performed on the first rank;
wherein the first rank calibrates the termination resistance value of the first rank to a second resistance value based on the second chip selection signal and the third chip selection signal when the write operation is not performed on the first rank
wherein the first resistance value is different from the second resistance value; and
wherein a termination resistance value corresponds to a value that impedance matches a receiving end for data during the write operation.

18. The semiconductor system of claim 17,
wherein the second rank calibrates the termination resistance value of the second rank to the first resistance value based on the command address and the second chip selection signal when a write operation is performed on the second rank; and
wherein the second rank calibrates the termination resistance value of the second rank to the second resistance value based on the first chip selection signal and the third chip selection signal when the write operation is not performed on the second rank.

19. The semiconductor system of claim 17, wherein, when a write operation is performed on the third rank, the third rank calibrates the termination resistance value of the third rank to the first resistance value based on the command address and the third chip selection signal; and
wherein, when the write operation is not performed on the third rank, the third rank calibrates the termination resistance value of the third rank to the second resistance value based on the first chip selection signal and the second chip selection signal.

20. A semiconductor device comprising:
a first rank configured to calibrate a first termination resistance value of the first rank to a first resistance value when a write command is generated from a command address during a state in which a first chip selection signal is received including a first pulse driven to a voltage level equal to or higher than a first reference voltage; and
a second rank configured to calibrate a second termination resistance value of the second rank to the first resistance value when the write command is input during a state in which a second chip selection signal is received including a second pulse driven to the voltage level equal to or higher than the first reference voltage;
wherein the first rank calibrates the termination resistance value of the first rank to a second resistance value when a write operation is performed on the second rank and the second chip selection signal is received including a pulse driven to a voltage level equal to or higher than a second reference voltage set higher than the first reference voltage;
wherein the first resistance value is different from the second resistance value; and
wherein a termination resistance value corresponds to a value that impedance matches a receiving end for data during the write operation.

21. A semiconductor device of claim 20, wherein the first resistance value is a target resistance value, and the second resistance value is a dynamic resistance value.

* * * * *